US006859257B2

(12) United States Patent
Korenaga

(10) Patent No.: US 6,859,257 B2
(45) Date of Patent: Feb. 22, 2005

(54) STAGE SYSTEM

(75) Inventor: Nobushige Korenaga, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/346,107

(22) Filed: Jan. 17, 2003

(65) Prior Publication Data

US 2003/0179359 A1 Sep. 25, 2003

(30) Foreign Application Priority Data

Jan. 18, 2002  (JP) .................................... 2002-010182

(51) Int. Cl.⁷ ...................... G03B 27/42; G03B 27/62; G03B 27/32; G05F 1/00
(52) U.S. Cl. ........................ 355/53; 355/75; 355/77; 318/647
(58) Field of Search ............................ 355/53, 77, 72, 355/75; 318/647; 250/492.2

(56) References Cited

U.S. PATENT DOCUMENTS

| | | | |
|---|---|---|---|
| 5,073,912 A | * 12/1991 | Kobayashi et al. | ........... 378/34 |
| 5,467,720 A | 11/1995 | Korenaga et al. | ............ 108/20 |
| 5,518,550 A | 5/1996 | Korenaga et al. | ........... 118/729 |
| 5,608,773 A | 3/1997 | Korenaga et al. | ............. 378/34 |
| 5,684,856 A | * 11/1997 | Itoh et al. | ...................... 378/34 |
| 5,841,250 A | 11/1998 | Korenage et al. | ........... 318/135 |
| 6,002,465 A | 12/1999 | Korenaga | ..................... 355/53 |
| 6,037,680 A | 3/2000 | Korenaga et al. | ............. 310/12 |
| 6,107,703 A | 8/2000 | Korenaga | ..................... 310/12 |
| 6,128,069 A | 10/2000 | Korenaga | ..................... 355/53 |
| 6,157,159 A | 12/2000 | Korenaga et al. | ........... 318/649 |
| 6,177,978 B1 | 1/2001 | Korenaga | ..................... 355/53 |
| 6,265,793 B1 | 7/2001 | Korenaga et al. | ............. 310/12 |
| 6,320,645 B1 | 11/2001 | Inoue et al. | .................. 355/53 |
| 6,479,991 B1 | * 11/2002 | Korenaga | ..................... 324/226 |
| 6,570,645 B2 | * 5/2003 | Korenaga et al. | ............. 355/75 |
| 2001/0031191 A1 | 10/2001 | Korenaga | ..................... 414/200 |
| 2002/0145721 A1 | 10/2002 | Korenaga et al. | ............. 355/75 |
| 2003/0007140 A1 | 1/2003 | Korenaga | ..................... 355/72 |

* cited by examiner

*Primary Examiner*—Alan Mathews
(74) *Attorney, Agent, or Firm*—Fitzpatrick, Cella, Harper & Scinto

(57) ABSTRACT

A stage system includes a movable stage, a force applying mechanism for applying, by use of an electromagnet, a force to the stage in a direction of a magnetic flux generated by the electromagnet, a moving mechanism for moving the electromagnet in the direction, and a controller for controlling one of the magnetic force of the electromagnet and a generated force thereof.

45 Claims, 16 Drawing Sheets

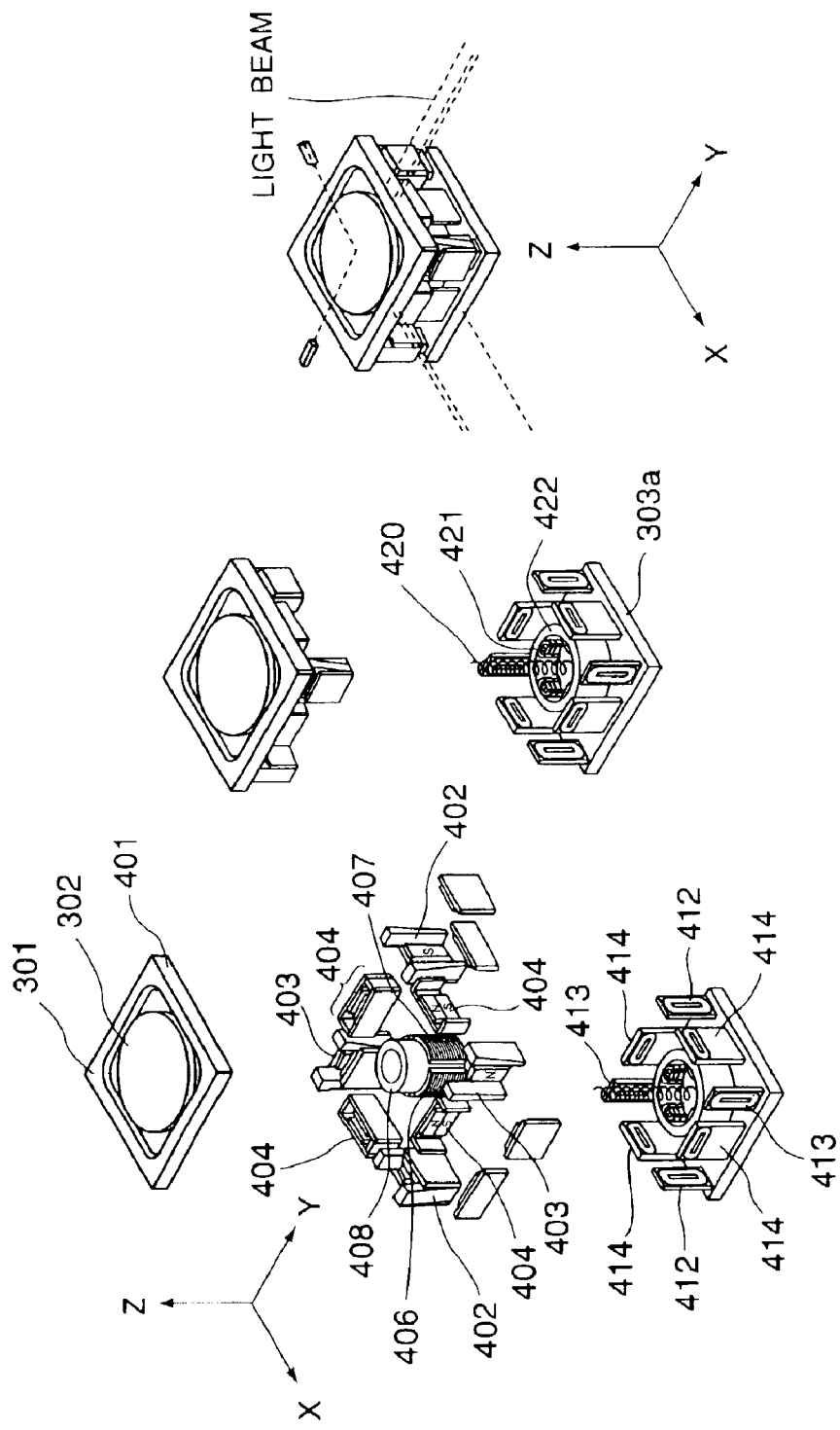

STAGE SYSTEM

FIELD OF THE INVENTION AND THE RELATED ART

This invention relates to a stage system having a high-speed and high-precision stage mechanism that can be suitably used in a semiconductor manufacturing apparatus, for example.

FIGS. 9A–9C schematically illustrate a main portion of a conventional stage system. As shown in these drawings, a guide 903 is fixed to a base (not shown), and it supports a stage 904 for carrying a workpiece 902 slidably in one axis direction relative to the guide 903. There are linear motor movable elements 905 held fixed at the opposite sides of the stage 904. Each linear motor movable element 905 is disposed opposed to a linear motor stator 906 without contact thereto. Each linear motor stator 906 is fixed to a base (not shown). Each linear motor movable element 905 comprises upper and lower units each including an integral structure of four-pole magnets 905a and a yoke 905b for circulating the magnetic fluxes of the magnets 905a. The linear motor stator 906 comprises a plurality of coils 906a (six in the case illustrated), which are disposed in an array and are held fixed by a stator frame 906b.

A linear motor 901 is a developed type ordinary brushless DC motor. By interchanging driving coils and their electric current directions in accordance with the relative positional relationship of the magnets 905a and the coils 905b, a desired force is produced in a desired direction.

In operation of the structure shown in FIGS. 9A–9C, first, while the stage 904 is held stationary, in accordance with the position of the stage 904, an electric current is applied to a predetermined linear motor coil 906a in a predetermined direction and for a predetermined time period, to produce acceleration of the stage 904. The acceleration is completed when a predetermined speed is reached, and then, a predetermined operation such as exposure or inspection, for example, is carried out. After a constant-speed period passes, an electric current is applied to a predetermined linear motor coil 906a in a predetermined direction and for a predetermined time period, to produce deceleration of the stage 904, thereby to stop the stage 904.

The position of the stage 904 is monitored by means of a high-precision position sensor, such as a laser interferometer (not shown), for example, and an electrical current is caused to flow to the linear motor coils 906a separately from the acceleration and deceleration, so as to reduce the error with reference to a desired position to zero. Thus, regardless of whether it is in the acceleration/deceleration period or in the constant-speed period, high-precision position control is carried out continuously.

SUMMARY OF THE INVENTION

The above-described conventional stage system has an advantage that, when linear motor driving is used, high-precision position control is carried out continuously. However, because the driving is based solely on the Lorentz's force, heat generation during the acceleration and deceleration is large. Further, since the heat generation source is close to the workpiece and yet it is difficult to cool the linear motor stator as a whole, if the heat generation of the linear motor is large, it causes problems of thermal expansion and deformation of components around the workpiece, thermal expansion and deformation of a measurement reference member, and disturbance of air density in the light path for the laser interferometer, which leads to degradation of measurement precision.

The present invention has been made in consideration of these problems, and it is an object of the present invention to provide a stage system having a high-speed and high-precision stage mechanism by which at least one of these problems peculiar to linear motor heat generation can be solved effectively.

In accordance with investigations and experiments made by the inventor of the subject application, it has been found that the following structures are specifically effective to achieve the object just described above.

Namely, in accordance with the present invention, there is provided a stage system, comprising: a movable stage; a force applying mechanism for applying, by use of an electromagnet, a force to said stage in a direction of a magnetic flux generated by said electromagnet; a moving mechanism for moving said electromagnet in a movement direction of said stage; and a controller for controlling one of the magnetic force of said electromagnet and a generated force thereof.

In one preferred form of this aspect of the present invention, said controller may preferably include a detector for detecting a magnetic flux signal of said electromagnet Said detector may preferably be arranged to detect a change in magnetic flux of said electromagnet by use of a search coil, and also, to detect the magnetic flux signal through integration of an electric voltage of the search coil. The detector may preferably be arranged to detect the magnetic flux signal of said electromagnet by use of a Hall element. The detector may preferably be arranged to detect the magnetic flux signal of said electromagnet by use of a magnetic resistance element. The controller may preferably be arranged to detect a driving force generated by said electromagnet by use of a strain gauge or a piezoelectric element and also to control said electromagnet on the basis of the detection.

Further, in one preferred form of this aspect of the present invention, said controller may preferably include a command applying unit for designating a generated force of said electromagnet, a detector for detecting a generated force of said electromagnet, an operation unit for calculating a difference between the generated force detected by said detector and the generated force designated by said command applying unit, and an amplifier for amplifying an output of said operation unit to drive said electromagnet. Said detector may preferably detect the generated force generated by said electromagnet by use of a strain gauge or a piezoelectric element, and said electromagnet may preferably be controlled on the basis of the detection.

Furthermore, a stage system according to the present invention may preferably have a controller arranged to generate in said electromagnet a force which is proportional to acceleration of said stage. The stage system may preferably comprise a Lorentz's force generating mechanism for generating a Lorentz's force in said stage, wherein said Lorentz's force generating mechanism may be arranged to apply a force to said stage from at least two sides of said stage.

The stage system may preferably be arranged so that the line of action of the force generated by said electromagnet substantially passes a gravity center of said stage. The stage system may further comprise a second moving mechanism for moving a portion of said Lorentz's force generating mechanism in the movement direction of said stage.

Further, in the stage system, the position of said stage and the position of said moving mechanism may be measured individually. Further, the position of said stage may be controlled by means of said Lorentz's force generating mechanism.

In accordance with another aspect of the present invention, there is provided a stage system, comprising: a stage for carrying a workpiece thereon, said stage including a portion of a Lorentz's force generating mechanism arranged to generate moments and forces in plural-axis directions and a plurality of magnetic material plates arranged to receive a generated force in an arbitrary direction along a plane; a plurality of electromagnets each being arranged to apply a force to said stage in a direction of a magnetic flux generated by it, said electromagnets being arranged to generate a generated force in an arbitrary direction along a plane; a moving mechanism for moving the electromagnet in an arbitrary direction along a plane so as to move the electromagnet in the movement direction of said stage, and also for moving a portion of said Lorentz's force generating mechanism at least in an arbitrary direction along a plane; a controller for controlling a magnetic flux of the electromagnet or a generated force of it, said controller including at least a command applying unit for designating a magnetic flux signal of said electromagnet or a generated force signal of it, and a detector for detecting the magnetic flux signal of said electromagnet or the generated force signal of it; an operation unit for calculating a difference between the magnetic flux signal or the generated force signal detected by said detector and a magnetic flux command or a generated force command designated by said command applying unit; and an amplifier for amplifying an output of said operation unit to drive said electromagnets.

In one preferred form of this aspect of the present invention, each of said electromagnets may preferably comprise an E-shaped yoke, a driving coil and a search coil, wherein said driving coil may be arranged to generate a magnetic flux between the E-shaped yoke and the magnetic material plate provided on said stage, and wherein said search coil may be arranged to detect a change in magnetic flux generated by said driving coil. The position of said stage may preferably be measured with respect to six-axis directions, by means of a light beam.

Further, the position of said stage may preferably be controlled by means of said Lorentz's force generating mechanism. The position of said stage may preferably be measured with respect to six-axis directions, by means of an interferometer. The stage may preferably include a reflection mirror having a 45-degree slant face.

Further, in one preferred form of this aspect of the present invention, said detector may preferably be arranged to detect a generated force produced by said electromagnets, by use of a strain gauge or a piezoelectric element. The position of said stage may preferably be measured with respect to six-axis directions, by means of a light beam. The position of said stage may preferably be controlled by means of said Lorentz's force generating mechanism. The position of said stage may preferably be measured with respect to six-axis directions, by means of an interferometer. The stage may preferably include a reflection mirror having a 45-degree slant face.

With the structure described above, a large thrust is produced by means of a driving mechanism including an electromagnet and means for moving the electromagnet. After a predetermined speed is reached, control is carried out by use of an actuator of a Lorentz's force type. Thus, by detecting a magnetic flux of the electromagnet and by driving the electromagnet while amplifying the difference between it and a magnetic flux command, an attraction force of the electromagnet can be controlled very precisely.

In accordance with a yet further aspect of the present invention, there is provided an exposure apparatus for transferring, by exposure, a pattern of an original onto a substrate, characterized by including a stage system as described above.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 3A and 3B are general views of a stage mechanism in a stage system according to a second embodiment of the present invention, wherein FIG. 3A is an exploded view and FIG. 3B is a perspective view.

FIGS. 4A, 4B and 4C are general views of a wafer top plate in the embodiment of FIGS. 3A–3C, wherein FIG. 4A is a first exploded view of a wafer top plate, FIG. 4B is a second exploded view of the wafer top plate, and FIG. 4C is a perspective view of the wafer top plate.

DESCRIPTION OF THE PREFERRED EMBODIMENTS

Preferred embodiments of the present invention-will now be described with reference to the attached drawings.

[First Embodiment]

Figure 1:
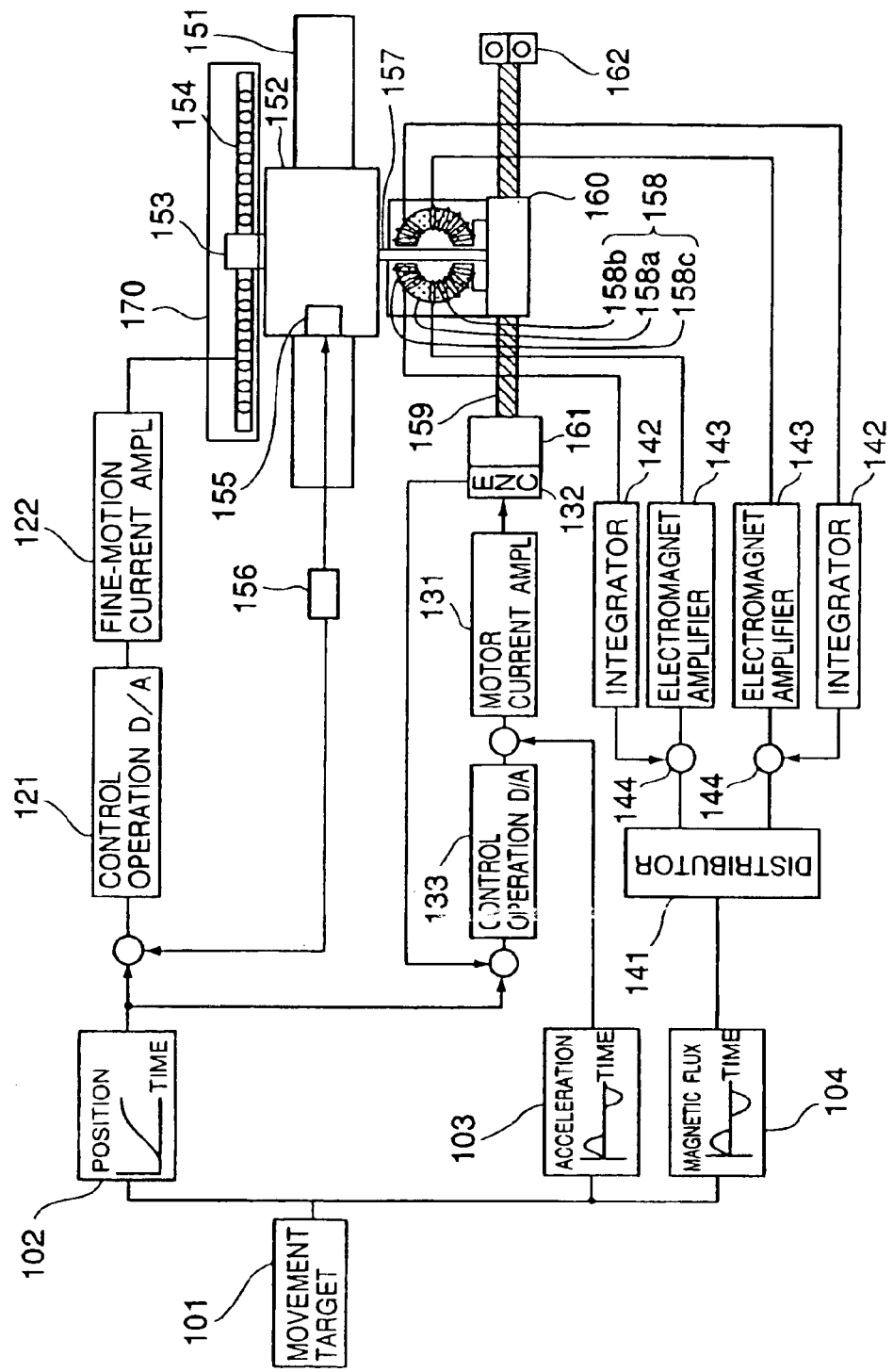
FIG. 1 is a diagrammatic view of a main portion of a stage system according embodiment of the present invention.

FIG. 1 is a schematic and diagrammatic view of a main portion of a stage system according to a first embodiment of the present invention. In FIG. 1, a guide 151 is fixed to a base (not shown), and it supports a stage 152 for carrying a workpiece thereon, slidably, in one-axis direction relative to the guide 151. A linear motor movable element 153 is fixedly provided at one side of the stage 152. A linear motor stator 154 is disposed opposed to the linear motor movable element 153 without contact thereto. The linear motor stator 154 is fixed to a base, not shown.

Figure 9A:
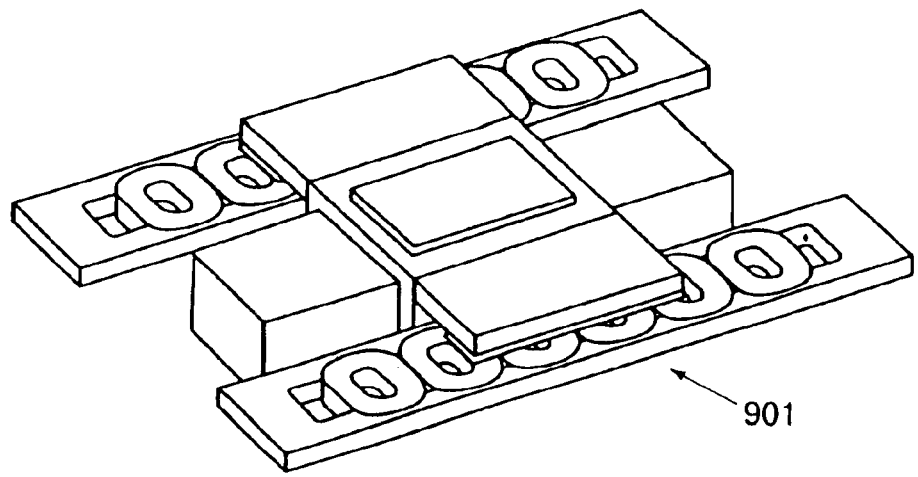
FIGS. 9A, 9B and C are schematic views of a main portion of a conventional stage system.
Figure 9B:
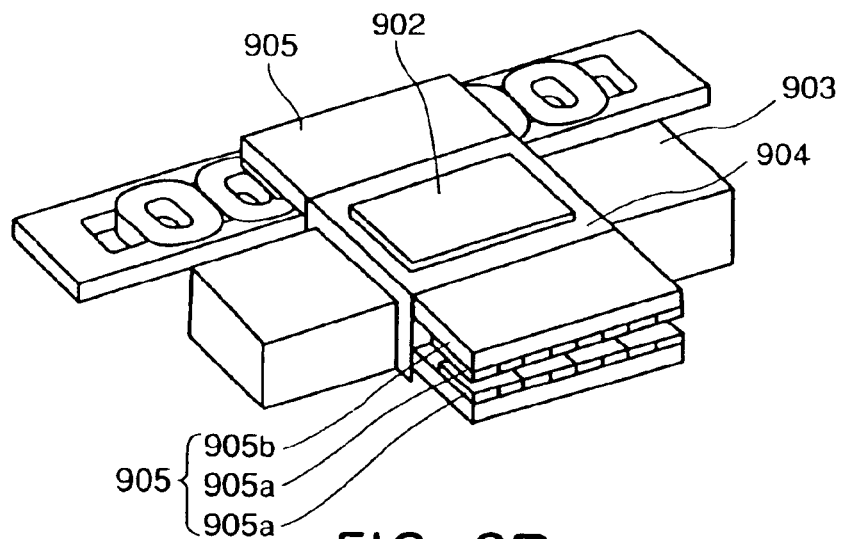
Figure 9C:
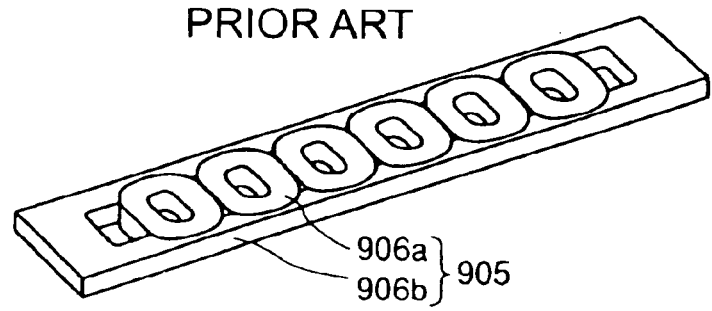

A linear motor 170 has a similar structure, such as shown in FIG. 9. A control system for this linear motor 170 is provided with an electrical current limiter, constituted by hardware or software, which functions to prevent flow of electrical current that may cause a heat generation problem. Also, as will be described later, as long as the control system operates in good order, the system is controlled so that, without relying on such a limiter, the flow of electrical current that may cause a heat generation problem is prohibited.

Mounted on the other side of the stage 152 is a magnetic material plate 157. There is a pair of electromagnet units (Lorentz's force producing mechanism) having electromagnets 158, which are disposed to sandwich the magnetic material plate 157 therebetween. The pair of electromagnet units is fixed on a nut 160, which can be moved approximately in the same direction as the stage 152, by means of a motor 161 and a feed screw 159. In other words, with the aid of the motor 161 and the feed screw 159, the pair of electromagnet units can move approximately in the same direction as the stage 152. Also, the feed screw system 159 for moving the electromagnet units is fixed to the base, not shown.

A small clearance is maintained between each of the electromagnets 158 and the magnetic plate 157, constituting the pair of electromagnet units, so that they are held without contact to each other. Each electromagnet 158 comprises a yoke 158a of an arcuate shape, a driving coil 158b wound around the yoke 158a, and a search coil 158c wound around the yoke 158a. When an electrical current is applied to the coil 158b, an attraction force is generated between the yoke 158a and the magnetic material plate 157. Also, the rate of change in magnetic flux passing through the yoke 158a can be measured by use of the search coil 158c. Electrical voltages or electrical currents to the coils 158b and 158c of each electromagnet 158 can be controlled independently from each other.

With this structure, by adjusting electrical voltages or currents to be applied to the coils 158b and 158c, the attraction force acting between each electromagnet 158 and the magnetic material plate 157 can be adjusted. As a result, combined forces acting from the pair of electromagnets 158 to the magnetic material plate 157 as well as the direction of those combined forces can be adjusted.

Figure 2:
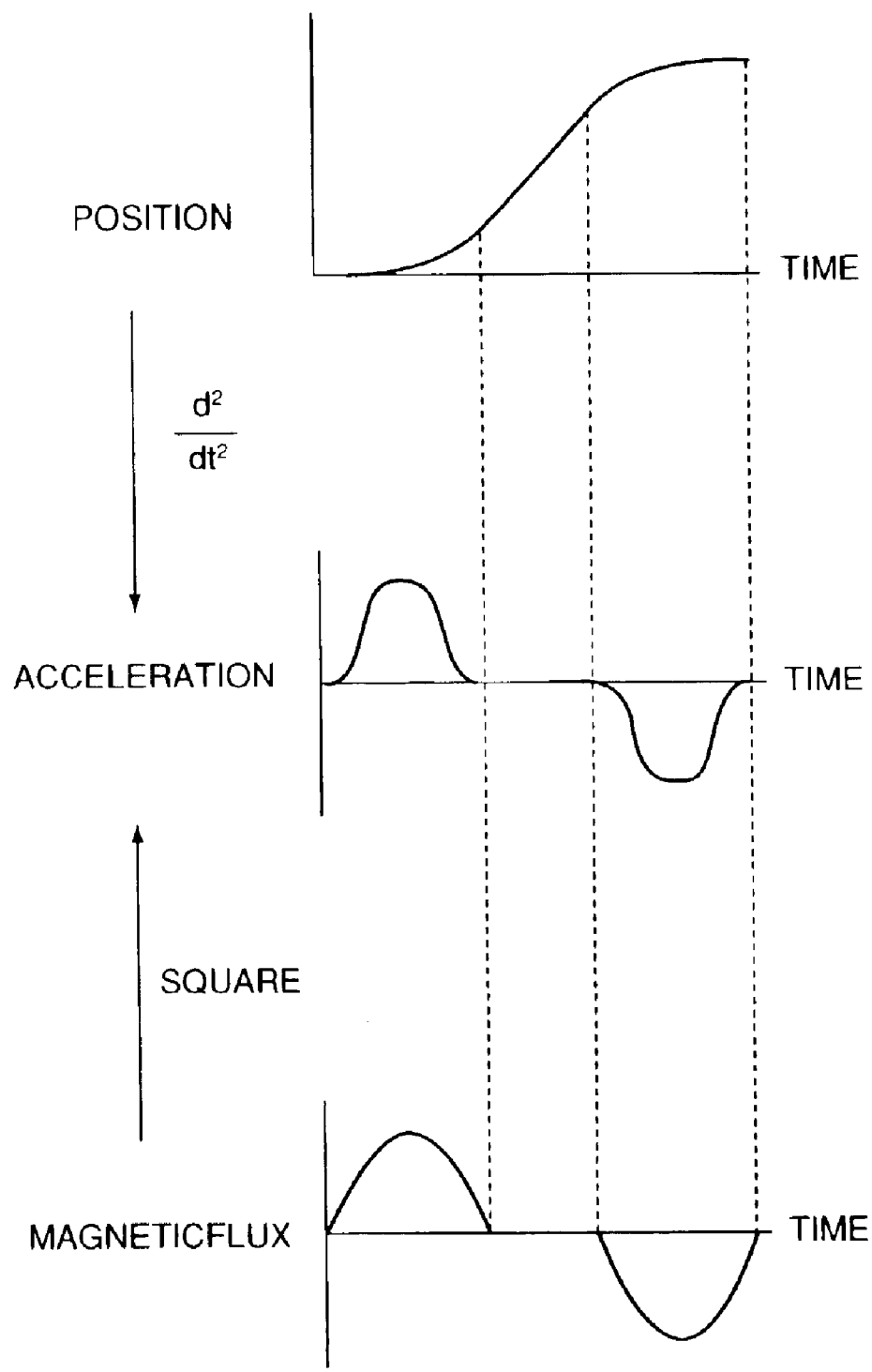
FIG. 2 is a graph for explaining the relationship between position profile, on profile and magnetic flux profile, in the embodiment of FIG. 1.

In the block diagram of FIG. 1, the control system includes a movement target 101 as movement target designating means, a position profile generator 102 for generating the relationship between the time and the position of the stage 152, to be taken at that time, on the basis of the movement target 101, an acceleration profile generator 103 for generating the relationship between the time and the acceleration to be provided at that time, and a magnetic flux profile generator 104 for generating the relationship between the time and the magnetic flux of the electromagnet 158 to be produced at that time. Here, FIG. 2 illustrates the relationships of the designated profiles 102, 103 and 104 in FIG. 1.

As the control system, more specifically, there is a stage position control system for providing feedback control of the position of the stage 152 by use of a fine-motion linear motor 170, an electromagnet position control system for performing feedback control of the position of the pair of electromagnets on the basis of a motor 161 and a feed screw 159, and an electromagnet attraction force control system for controlling the attraction force of the electromagnet.

The output of the position profile generator 102 is applied to the stage position control system and a nut position control system. The output of the acceleration profile generating means 103 is applied as a feed-forward signal to a motor current amplifier 131 of the electromagnet position control system. The output of the magnetic flux profile generator 104 is applied to the electromagnet control system.

A fine-motion LM position servo system comprises an operation unit, which functions to perform a control operation as can be represented by PID, through a control operation circuit 121, to a difference between the position where the stage 152 should be currently present as designated by the position profile generator 102 and the current position of the stage 152 measured by the interferometer system 156. The result of the operation is outputted as an analog electrical voltage. The fine-motion LM position servo system further comprises a fine-motion amplifier 122 for supplying an electrical current proportional to the produced analog output voltage to a linear motor 170, the linear motor 170, which applies a thrust to the stage 152 in response to that electrical current, and an interferometer 156 for measuring the position of the linear motor 170. This portion constitutes an ordinary position servo system wherein the output of the position profile generator 102 is taken as a command value. However, if a large thrust is necessary, a force can be obtained from an electromagnet control system to be described later.

The linear motor 170 is provided only to produce a small thrust necessary for removing a small positional error with respect to the target position. Therefore, no electrical current flows therethrough that may cause a heat generation problem. Also, the electrical current of the linear motor 170 is limited by software or hardware such that, even if the operational association with an attraction FF system malfunctions, the flow of electrical current that may cause a heat generation problem is prohibited.

The electromagnet position control system functions to move the position of the pair of electromagnet units to follow the position profile 102. Although the electromagnet 158 has an advantage that it generates a large attraction force with very small heat generation, a clearance must be maintained between it and the magnetic material plate opposed. In order to continue the application of a desired force from the electromagnet 158 to the magnetic material plate 157 and then to the stage 152, it is necessary that the electromagnet 158 moves to follow the motion of the stage 152 to prevent contact at the clearance.

To this end, by means of the position profile 102, the position of the electromagnet 158 is inputted into a position control system in which feedback is made through an encoder (END) 132 of the motor 161, and the electromagnet 158 is moved by the motor 161 and the feed screw 159 (moving mechanism) to follow substantially the same position profile 102 as that of the stage 152. By this, the relative position of the electromagnet 158 and the stage 152 can be maintained to be substantially constant.

During acceleration, the motor 161 produces, in addition to a torque corresponding to a combined force of the electromagnet units, a torque for accelerating the inertia of the electromagnet 158 and feed screw 159 system. To this end, during acceleration, a positional deviation of some amount has to be accumulated in the position control system. In consideration of this, the output of the acceleration profile generator 103 is added to the output of the control operation circuit 133. The resultant is applied to the motor current amplifier 131, and acceleration is designated to the motor 161 as in feed forward, such that the electromagnet 158 is moved without accumulation of positional deviation during the acceleration (that is, a controller for causing the electromagnet to generate a force proportional to the acceleration of the stage 152 is constituted).

Anyway, while the motor 161 involves heat generation to some extent, since the heat source is concentrated locally, cooling is relatively easy. Also, since it can be disposed away from the stage 152 or from a workpiece to be placed on that stage, the influence of heat generation is not easily transmitted. In a constant-speed running period after completion of the acceleration, the feed screw 159 system operates to move the nut 160 position substantially at the same speed as that of the stage 152 so as to avoid contact of the electromagnet 158 and the magnetic material plate 157.

The electromagnet attraction force control system is a control system for generating a desired combined thrust between the pair of electromagnet units and the magnetic material plate 157. This electromagnet attraction force control system comprises a distributor 141 for distributing the magnetic flux profile 104 to one of two electromagnet control systems, an integrator 142 for integrating the electrical voltage of the search coil 158c to generate a magnetic flux signal, a difference circuit 144 for calculating a difference between the magnetic flux profile 104 and the above-described magnetic flux signal, and an electromagnet amplifier 143 for amplifying the output of the difference circuit to drive the electromagnet 158.

Each of the pair of electromagnets 158 is provided with an integrator 142, electromagnet amplifier 143, and a different circuit 144 described above. The system, which comprises an integrator 142, an electromagnet amplifier 143, a difference circuit 144, a driving coil 158b and a search coil 158c, functions to control the magnetic flux generated between the electromagnet 158 and the magnetic material plate 157 so that it follows the magnetic flux profile 104 (magnetic flux signal designator). Hereinafter, the system comprising an integrator 142, an electromagnet amplifier 143, a difference circuit 144, a driving coil 158b and a search coil 158c, will be referred to as a magnetic flux control system (controller).

The search coil 158c is a coil being wound to share the magnetic path with the driving coil 158b. If the magnetic flux produced between the electromagnet yoke 158a and the magnetic material plate 157 changes, an electrical voltage proportional to this changing rate is generated in the search coil 158c. Thus, by integrating this signal, the magnetic flux generated between the electromagnet yoke 158a and the magnetic material plate 157 can be detected (detection through a detector). The magnetic flux control system calculates, by use of an operation circuit, the integration value, that is, the difference between a signal corresponding to the magnetic flux and the magnetic flux profile 104, and after amplifying it through an amplifier, it drives the electromagnet 158. Therefore, the magnetic flux generated between the electromagnet 158 and the magnetic material plate 157 is controlled so as to follow the magnetic flux profile 104.

The attraction force generated between the electromagnet 158 and the magnetic material plate 157 is proportional to the square of the magnetic flux. Therefore, controlling the magnetic flux means controlling the attraction force. Thus, the electromagnet 158 can generate a desired attraction force for acceleration of the stage 152.

It should be noted that the magnetic flux controller is provided to control the generated force (here, attraction force) of the electromagnet. In short, what is required is to control the attraction force of the electromagnet. Therefore, the magnetic flux control is not the sole solution. In other words, if a piezoelectric element or a strain gauge is attached to the electromagnet or to a portion of a member to be attracted, distortion of the electromagnet or of the member to be attracted, to be caused as the electromagnet generates an attraction force can be detected by means of the piezoelectric element or strain gauge. Since this strain is a quantity having a correlation with the attraction force, an attraction force target as converged into a strain target may be designated, and the electromagnet may be controlled while amplifying the difference between this designated value and the strain signal detected by the strain gauge or piezoelectric element. The attraction force can be controlled as a result of it. Thus, attraction force control can be done by use of a piezoelectric element or a strain gauge. Further, in this embodiment, the linear motor 170 is not always necessary.

Controlling the magnetic flux of the electromagnet 158 to follow the magnetic flux profile 104 involves the following advantages. One advantage is that desired acceleration is assured even if the clearance changes. When the position of the electromagnet 158 and the position of the stage 152 are idealistically synchronized with each other and the clearance does not change, a desired attraction force can be generated even if the electrical current of the electromagnet 158 is applied in open. Thus, a desired acceleration can be accomplished in this case. However, the clearance between the position of the electromagnet 158 and the position of the stage 152 is variable due to an error in the position control system of the electromagnet 158 or by mechanical deformation around the electromagnet 158. The attraction force of the electromagnet 158 has a large dependency upon the clearance and, therefore, if the electrical current of the electromagnet is controlled in open, the attraction force would change largely. On that occasion, the electromagnet 158 and the stage 152 cannot be synchronized with each other. Namely, if the system is arranged to control the magnetic flux, then the position control system of the electromagnet 158 does not need a high precision any more. Additionally, the rigidity around the electromagnet 158 can be designed to be relatively low.

Another advantage is that the influence of non-linearity of the magnetic material can be avoided. Idealistically, in the electromagnet 158, the magnetic flux is proportional to the electrical current and the attraction force is proportional to the square of the electrical current. Practically, however, the magnetic flux is not proportional to the electrical current, and there is a non-linear relation. Thus, if the magnetic flux is to be controlled only by the electrical current, it becomes necessary to correct the relationship between the electrical current and the magnetic flux on the basis of a table. Since this table is variable with the clearance, a huge table should be prepared to perform correction on the basis of the electrical current and the clearance. If it is arranged to detect the magnetic flux for negative feedback, the non-linearity of the material can be avoided with a simple structure.

Further, since, basically, the electromagnet 158 can produce an attraction force only, either one of the pair of electromagnets 158 may be chosen in accordance with the direction of a force to be generated, thereby to control the direction of the force generated. This is accomplished by the distributor 141. The distributor 141 functions to select one of the magnetic flux control systems to which the magnetic flux profile 104 should be applied. More specifically, the sign (positive or negative) of the acceleration profile 103 and the sign of the magnetic flux profile 104 are registered with each other beforehand and, in accordance with the sign (positive or negative) of the magnetic profile 104, the distributor 104 applies the magnetic flux profile 104 to that magnetic flux control system, which should produce a force in that direction.

If the acceleration profile 103 and the magnetic flux profile 104 are positive and when a force is going to be applied to the stage in a rightward direction as viewed in FIG. 1, in the first half of the magnetic flux profile, that is, when the magnetic flux profile 104 is positive, the magnetic flux profile 104 is applied to the magnetic flux control system that includes a right-hand side electromagnet 158 as viewed in FIG. 1. In the second half of the magnetic flux profile 104, that is, when the magnetic flux-profile 104 is negative, the magnetic flux profile 104 is applied to the magnetic flux control system that includes a left-hand side electromagnet 158 as viewed in FIG. 1.

The position profile 102, the acceleration profile 103 and the magnetic flux profile 104 have the following relationship. The second differentiation of the position profile 102 corresponds to the acceleration profile 103. The relationship between the attraction force and the time necessary for accelerating the stage 152 is "attraction force profile"="acceleration profile"×"stage mass". Also, "attraction force profile"=the square of "magnetic flux profile"×"constant". Thus, the relationship "acceleration profile"×"stage mass"="constant"×"magnetic flux profile" should well be provided. This constant may be determined experimentally or it may be determined theoretically on the basis of the number of winding turns of the search coil 158c, the sectional area of the yoke 158a, the integration time constant, and the like. As a result of this, it is assured that an attraction force is applied to the stage 152 from the electromagnet 158, for approximately synchronized motion with the electromagnet 158.

In the manner described above, the stage 152 is accelerated by means of the feed screw 159 system and the electromagnet 158. After the acceleration is completed, the electrical current to the electromagnet 158 system is made null and, simultaneously with insulation of floor vibration, the feed screw 159 system operates to control the position of the electromagnet 158 so that is does not contact the magnetic material plate 157. In parallel to these operations, by means of the fine-motion linear motor 170, high-precision position control is carried out continuously. With this procedure, a large thrust and low heat generation, as well as high-precision position control, can be accomplished simultaneously.

[Second Embodiment]

Figures 3A, 3B:
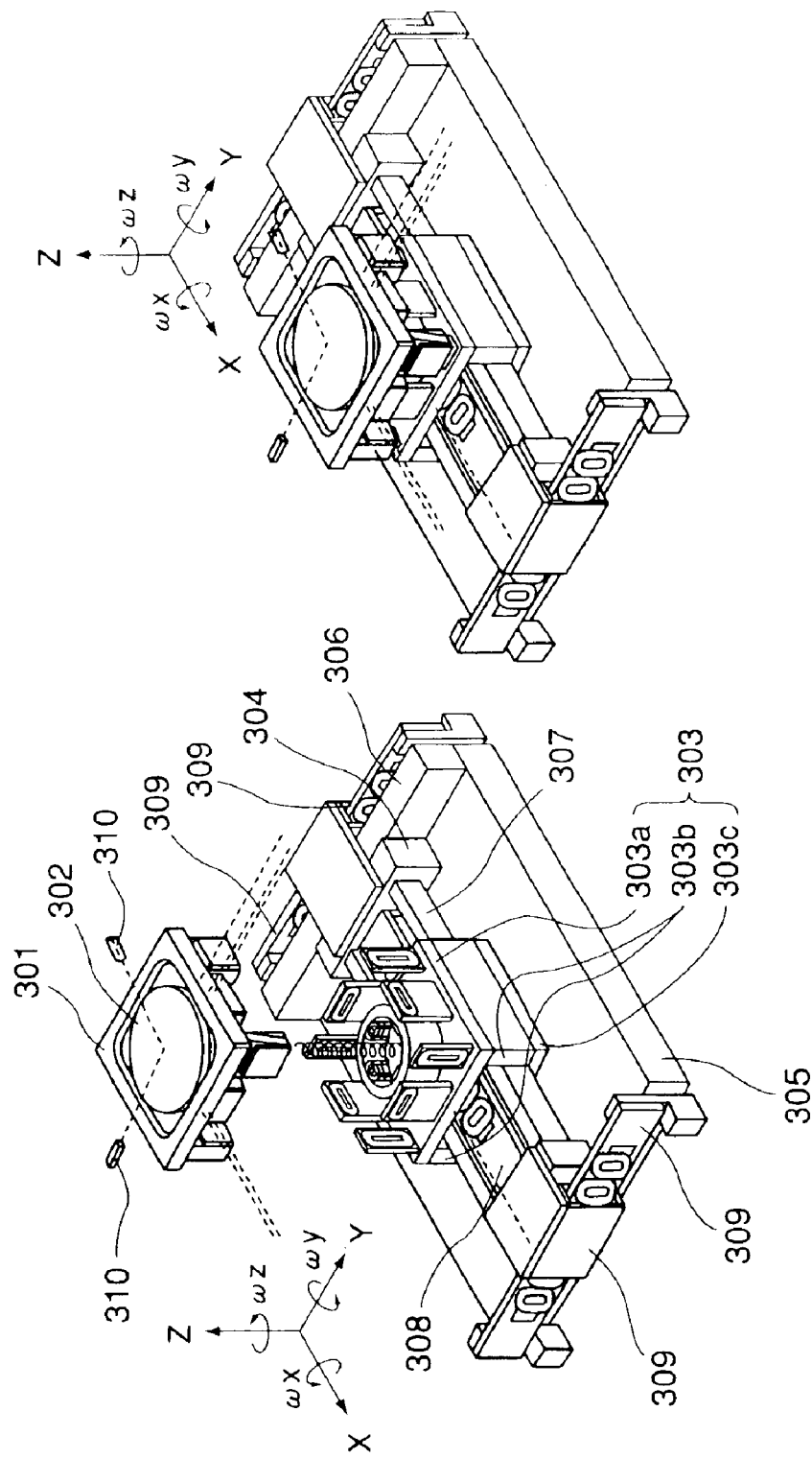

FIGS. 3A and 3B are general views of a stage mechanism in a stage system according to a second embodiment of the present invention. In this embodiment, the basic structure of the present invention is applied to a wafer stage of a semiconductor exposure apparatus. Specifically, FIG. 3A is an exploded view and FIG. 3B is a perspective view.

FIGS. 4A, 4B and 4C are general views of a wafer top plate of FIGS. 3A and 3B, wherein FIG. 4A is a first exploded view of the wafer top plate, FIG. 4B is a second exploded view of the wafer top plate, and FIG. 4C is a perspective view thereof. A wafer top plate 301 carries a wafer (workpiece) thereon by means of a wafer chuck 302, and it functions to position the same with respect to six-freedom directions of X, Y, Z, ωx, ωy and ωz. The wafer top plate 301 has a rectangular plate-like shape, and it is formed with a recessed portion at the center thereof. A wafer chuck 302 for carrying a wafer thereon is mounted on this recessed portion. Mounted on a side face of the wafer top plate 301 is a mirror 401 for reflecting a laser from an interferometer (not shown), for measurement of the position of the wafer top plate 301.

Attached to the bottom face of the wafer top plate 301 are eight linear motor movable elements. Each of them (X movable element 402, Y movable element 403 and Z movable element 404) has two sets of two-pole magnets, being magnetized in the thickness direction, and yokes. These two sets of magnets and yokes are connected with each other by side plates, whereby a box-like structure is provided. They are opposed to each other so as to sandwich a linear motor stator, to be described later, between them without contact thereto.

In FIGS. 3 and 4, four movable elements of the above-described eight movable elements, which are to be disposed approximately at the central portion of the rectangular-shaped top plate, provide Z movable elements 404. In the Z movable elements 404, the two-pole magnets described above are arrayed along a Z direction, and they produce a thrust in the Z direction in cooperation with the electrical current that flows through a Z stator elliptical coil (to be described) having a straight portion perpendicular to the Z direction. These movable elements will be referred to as Z1 to Z4 movable elements, respectively.

Two movable elements of the remaining four movable elements, which are disposed substantially at corners of the rectangular top plate, provide X movable elements 402. In the X movable elements 402, the two-pole magnets described above are arrayed along an X direction, and they produce a thrust in the X direction in cooperation with the electrical current that flows through an X stator elliptical coil (to be described) having a straight portion perpendicular to the X direction. These movable elements will be referred to as X1 and X2 movable elements, respectively.

The remaining two movable elements are disposed substantially at corners of the rectangular top plate, and they provide Y movable elements. In the Y movable elements 403, the two-pole magnets described above are arrayed along a Y direction, and they produce a thrust in the Y direction in cooperation with the electrical current that flows through a Y stator elliptical coil (to be described) having a straight portion perpendicular to the Y direction. These movable elements will be referred to as Y1 and Y2 movable elements, respectively.

Provided substantially at the central portion on the bottom face of the rectangular wafer top plate 302 is a magnetic material supporting cylindrical member 408 having a cylindrical shape. At the outer periphery of this magnetic material supporting cylindrical member 408, four magnetic material blocks of arcuate shape (two X arcuate magnetic material blocks 406 and two Y arcuate magnetic material blocks 407) are fixed.

Among them, two arcuate magnetic material blocks 406 are disposed along the X direction, and they are disposed opposed to E-shaped electromagnets 421 (to be described later), which are similarly disposed along the X direction, without contact thereto, such that the blocks 406 receive a large attraction force in the X direction from the E-shaped electromagnets 421. Hereinafter, these blocks will be referred to as X1 and X2 blocks, respectively.

The remaining two arcuate magnetic material blocks 407 are disposed along the Y direction, and they are disposed opposed to E-shaped electromagnets 421 (to be described later), which are similarly disposed along the Y direction, without contact thereto, such that the blocks 407 receive a large attraction force in the Y direction from the E-shaped electromagnets 421. Hereinafter, these blocks will be referred to as Y1 and Y2 blocks, respectively.

A weight compensating spring 420 is disposed in a hollow portion of the magnetic material supporting cylinder 408 of a cylindrical shape, and the top end of the spring is connected to the central portion of the bottom face of the wafer top plate 302 to support the weight of the wafer top plate 302. The weight compensating spring 420 is designed with a very small spring constant with respect to the weight supporting direction as well as the remaining five-freedom directions, such that vibration transmission through the weight compensating spring 402 can be disregarded.

The Z coordinates of the lines of action of the forces to be produced by the X1 and X2 movable elements 402 are approximately registered with each other, and also they are approximately registered with the Z coordinates of the gravity center of the wafer top plate 302, including X1 and X2 movable elements 402, Y1 and Y2 movable elements 403, Z1, Z2, Z3 and Z4 movable elements 404, magnetic material supporting cylindrical member 408, and four arcuate magnetic material blocks 406 and 407. As a result, a rotational force about the Y axis due to the X-direction thrust force, produced in the X1 and X2 movable elements 402, hardly acts on the wafer top plate 302.

The Z coordinates of the lines of action of the forces to be produced by the Y1 and Y2 movable elements 403 are approximately registered with each other, and also they are approximately registered with the Z coordinates of the gravity center of the wafer top plate 302, including X1 and X2 movable elements 402, Y1 and Y2 movable elements 403, Z1, Z2, Z3 and Z4 movable elements 404, magnetic material supporting cylindrical member 408, and four arcuate magnetic material blocks 406 and 407. As a result, a rotational force about the X axis due to the Y-direction thrust force, produced in the Y1 and Y2 movable elements 403, hardly acts on the wafer top plate 302.

The Z coordinates of the lines of action of the attraction forces acting on the X1 and X2 blocks 406 are approximately registered with each other, and also they are approximately registered with the Z coordinates of the gravity center of the wafer top plate 302, including X1 and X2 movable elements 402, Y1 and Y2 movable elements 403, Z1, Z2, Z3 and Z4 movable elements 404, magnetic material supporting cylindrical member 408, and four arcuate magnetic material blocks 406 and 407. As a result, a rotational force about the Y axis due to the X-direction attracting force, acting on the X1 and X2 blocks 406, hardly acts on the wafer top plate 302.

The Z coordinates of the lines of action of the attraction forces acting on the Y1 and Y2 blocks 407 are approximately registered with each other, and also they are approximately registered with the Z coordinates of the gravity center of the wafer top plate 302, including X1 and X2 movable elements 402, Y1 and Y2 movable elements 403, Z1, Z2, Z3 and Z4 movable elements 404, magnetic material supporting cylindrical member 408, and four arcuate magnetic material blocks 406 and 407. As a result, a rotational force about the X axis due to the Y-direction attracting force, acting on the Y1 and Y2 blocks 407; hardly acts on the wafer top plate 302.

Six light beams in total are projected to the wafer top plate 302, to the position of the wafer top plate 302 with respect to the six-freedom directions. Specifically, by means of two interferometer beams being parallel to the X axis and having different Z positions, the position in the X direction as well as the rotational quantity in the $\omega y$ direction are measured. By means of three interferometer beams being parallel to the Y axis and having different X and Z positions, the position in the Y direction as well as the rotational quantities in the $\omega x$ and $\omega y$ directions are measured. Further, by measuring the position of reflection of light obliquely impinging on a wafer, placed on the wafer chuck 301, the position in the Z direction can be measured. Practically, these signals are processed synthetically to calculate X, Y, Z, $\omega x$, $\omega y$, and $\omega z$ coordinates of a certain representative point.

Disposed below the wafer top plate 302 and an X stage 303 and a Y stage 304, which function as a base for providing a thrust or an attracting forcer top plate 302. A Y yaw guide 306 is fixed on a base surface table 305, such that the Y stage, which is guided by the side face of the Y yaw guide 306 and the top face of the base surface table 305, is slidably supported on the base surface table 305 in the Y direction by means of an air slide (not shown).

The Y stage 304 mainly comprises four components, that is, two X yaw guides 306, a Y large slider and a Y small slider. The Y large slider is opposed to the side face of the Y yaw guide 306 and the top face of the base surface table 305 through air pads (not shown) provided at the side face and bottom face of it. The Y small slider is opposed to the top face of the base surface table 305 through an air pad (not shown) provided on the bottom face thereof. As a result of this, the Y stage 304 as a whole is slidably supported by the side face of the Y yaw guide 306 and the top face of the base surface table 305 in the Y direction, as described before.

On the other hand, an X stage 303, which is guided by side faces of two X yaw guides 307 and the top face of the base surface table 305, extends so as to surround the Y stage 304 about the X axis and is slidably supported by an air slide (not shown). The X stage 303 mainly comprises four components, that is, two X stage side plates 303b, an upper X stage top plate 303a, and a lower X stage bottom plate 303c. The X stage bottom plate 303c is opposed to the top face of the base surface table 305 through an air pad (not shown) provided on the bottom face thereof. The two X stage side plates 303b are opposed to the side faces of the two X yaw guides 307 (components of Y stage 304) through air pads (not shown) provided on the side face thereof.

The bottom face of the X stage top plate 303a and the top face of the X yaw guide 307, as well as the top face of the X stage bottom plate 303c and the bottom face of the X yaw guide 307 are kept out of contact with each other. As a result of this, the X stage 303 as a whole is slidably supported in the X direction by means of the side faces of the two X yaw guides 307 and the top face of the base surface table 305, and consequently, the X stage 303 is made slidable two-dimensionally in the X and Y directions.

A driving mechanism includes one (for X driving) and two (for Y driving) long-range linear motors 308 and 309, each being of a multiple-phase coil switching type. The stator is made by inserting plural coils, arrayed along a stroke direction, into a frame. The movable element is made by disposing four-pole magnets on a yoke plate, and the magnets have a magnetic pole pitch the same as the coil span of the above-described coil. It is formed into a box-like magnet unit opposed to sandwich the coil (to move a portion (movable element) of the Lorentz's force generating mechanism in the movement direction of the stage). By selectively causing electrical current to flow to coils of the stator in accordance with the position of the movable element, a thrust is produced. This is as in an ordinary brushless DC linear motor.

There is a mirror on the side face of the X stage top plate 303a, for precision measurement of the position of the X stage 303 in the X and Y directions by means of a laser interferometer (not shown). Namely, independently of the wafer top plate 301, the position of the X stage 303 with respect to the X and Y directions can be measured precisely by use of a laser interferometer.

Fixed to the top of the X stage top plate 303a are stators 412, 413 and 414 of eight linear motors for position control of the wafer top plate 301 in six-axis directions, four E-shaped electromagnets 421 being supported by an electromagnet supporting cylindrical member 422 for applying acceleration in the X and Y directions to the wafer top plate 301, and an end of a weight supporting spring 420 for supporting the weight of the wafer top plate 302.

The above-described stators 412, 413 and 414 have a structure that a coil of an elliptical shape is supported by a peripheral frame. They are disposed opposed to the movable element of the X linear motor 308 fixed to the bottom face of the wafer top plate 303a, without contact thereto.

Four of the above-described eight stators (X stators 412, Y stators 413, Z stators 414), which are to be disposed approximately at the central portion of the side of the rectangular-shaped X stage top plate 303a, provide Z stators 414. In the Z stators 414, the elliptical coils described above are disposed so that their straight portions are perpendicular to the Z direction, such that they can apply a thrust in the Z direction to the two-pole magnets of the Z movable elements 404, being arrayed along the Z direction. These coils will be referred to as Z1 to Z4 coils, respectively.

Two stators of the remaining four stators are disposed at corners of the rectangular X stage top plate 303b, and they provide X stators 412. In the X stators 412, the two straight portions of the elliptical coil are perpendicular to the X direction, and the two straight portions are disposed along the X direction, such that they can apply a thrust in the X direction to the two-pole magnets of the X movable elements 402, being arrayed along the X direction. These coils will be referred to as X1 and X2 coils, respectively.

The remaining two stators are similarly disposed at corners of the rectangular X stage top plate 303a, and they provide Y stators 413. In the Y stators 413, the two straight portions of the elliptical coil are perpendicular to the Y direction, and the two straight portions are disposed along the Y direction, such that they can apply a thrust in the Y direction to the two-pole magnets of the Y movable elements 403, being arrayed along the Y direction. These coils will be referred to as Y1 and Y2 coils, respectively.

In this embodiment, as described above, a Lorentz's force generating mechanism is constituted by eight movable elements 402, 403, 404 and eight stators 412, 413 and 414, for example.

Figure 5:
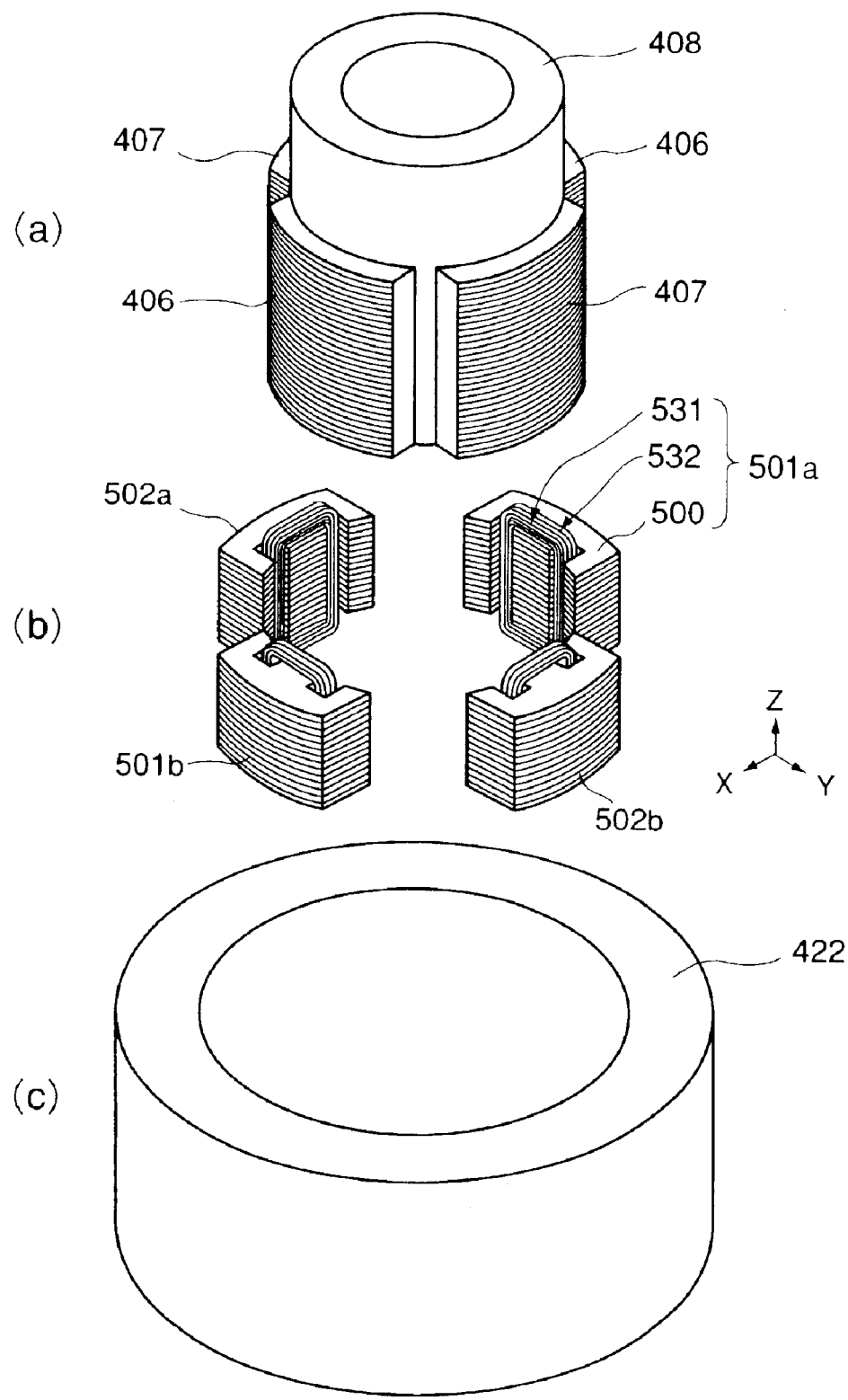
FIG. 5 is a detailed view of an electromagnet unit according to the second embodiment of the present invention, wherein a portion (a) illustrates a magnetic material supporting cylindrical member and magnetic material blocks of an arcuate shape, a portion (b) illustrates E-shaped electromagnets, and a portion (c) shows an electromagnet supporting cylindrical member.

The electromagnet supporting cylinder 422 is disposed substantially at the central portion of the rectangular-shaped X stage top plate 303a, and there are four E-shaped electromagnets 421 inside the cylinder 422. Here, FIG. 5 shows details of the electromagnet according to this embodiment. More specifically, a portion (a) in FIG. 5 shows a magnetic material supporting cylinder and arcuate magnetic material blocks, and a portion (b) of FIG. 5 shows E-shaped electromagnets. A portion (c) of FIG. 5 shows an electromagnet supporting cylinder. As shown in FIG. 5, the E-shaped electromagnet 421 (FIG. 4) comprises a magnetic material block having an approximately E-shaped cross section (X E-shaped electromagnet (E-shaped yoke) 501a and 501b, Y E-shaped electromagnet (E-shaped yoke) 502a and 502b), a driving coil 532, and a search coil 531.

The driving coil 532 is a coil for generating an attraction force in the E-shaped magnetic material blocks 501a, 501b, 502a and 502b and arcuate-shaped magnetic material blocks 406 and 407. The search coil 531 is provided to detect a change in magnetic flux to be produced between the magnetic material blocks 406 and 407. The driving coil 532 and the search coil 531 are wound around a central protrusion of the E-shape. The end faces of the three protrusions of the E-shape are made into an arcuate shape, rather than straight. They are disposed to be opposed to the arcuate magnetic material blocks 406 and 407 fixed to the wafer top plate 302, with a clearance not smaller than tens of microns, without contact thereto. By causing electrical currents to flow to these coils, an attraction force can be applied to the arcuate magnetic material blocks 406 and 407.

Among the E-shaped electromagnets 501a, 501b, 502a and 502b, two electromagnets are disposed along the X direction so as to be opposed to the X1 and X2 blocks 406, such that they can apply an attraction force in the X direction and −X direction to the X1 and X2 blocks 406. Hereinafter, they will be referred to as X1 and X2 electromagnets, respectively.

The remaining two of the E-shaped electromagnets 501a, 501b, 502a and 502b are disposed along the Y direction so as to be opposed to the Y1 and Y2 blocks 407, such that they can apply an attraction force in the Y direction and −Y direction to the Y1 and Y2 blocks 407. Hereinafter, they will be referred to as Y1 and Y2 electromagnets, respectively.

The E-shaped electromagnets 501a, 501b, 502a and 502b have a function only to produce an attraction force. This is the very reason for that, with regard to the driving directions of X and Y, an electromagnet for generating an attracting force in a positive direction and an electromagnet for generating an attraction force in a negative direction are provided separately.

The magnetic material blocks 406 and 407 are made into an arcuate shape around the Z axis, while the end faces of the E-shape of the E-shaped electromagnets 501a, 501b, 502a and 502b are made into an arcuate shape around the Z axis. With this arrangement, the four magnetic material blocks 406 and 407 and the four E-shaped electromagnets 501a, 501b, 502a and 502b can rotate freely about the Z axis, without contact to each other. Further, in the rotation, there occurs no change in the clearance, such that there occurs no change in the attraction force to be generated by the electromagnet for the same electrical current.

Each of the arcuate magnetic material blocks 406 and 407 and the E-shaped magnetic material blocks 501a, 501b, 502a and 502b is made by accumulating thin plate materials, each layer being electrically insulated. This prevents flow of an eddy current within the arcuate magnetic material blocks 406 and 407 due to a change in magnetic flux. As a result, the attraction force can be controlled up to a high frequency.

With the structure described above and with a linear motor, thrust forces in six-axis directions can be applied from the X stage 303 to the wafer top plate 301, and a large attraction force in the X and Y direction can be generated in the electromagnet. Long stroke motion is unnecessary in regard to Z, ωx, ωy and ωz directions. On the other hand, as regards the X and Y directions, a thrust and an attraction force should be applied with a large stroke. However, the linear motor and the electromagnet have a very short stroke in the X and Y directions. To the contrary, the X stage 303 has a long stroke in the X and Y directions. In consideration of this, while moving the X stage 303 in the X and Y directions, thrust or an attraction force in the X and Y directions is applied to the wafer top plate 301. With this arrangement, the thrust or attraction force in the X and Y direction can be applied to the wafer top plate 301, throughout a long range in the X and Y directions.

Figure 6:
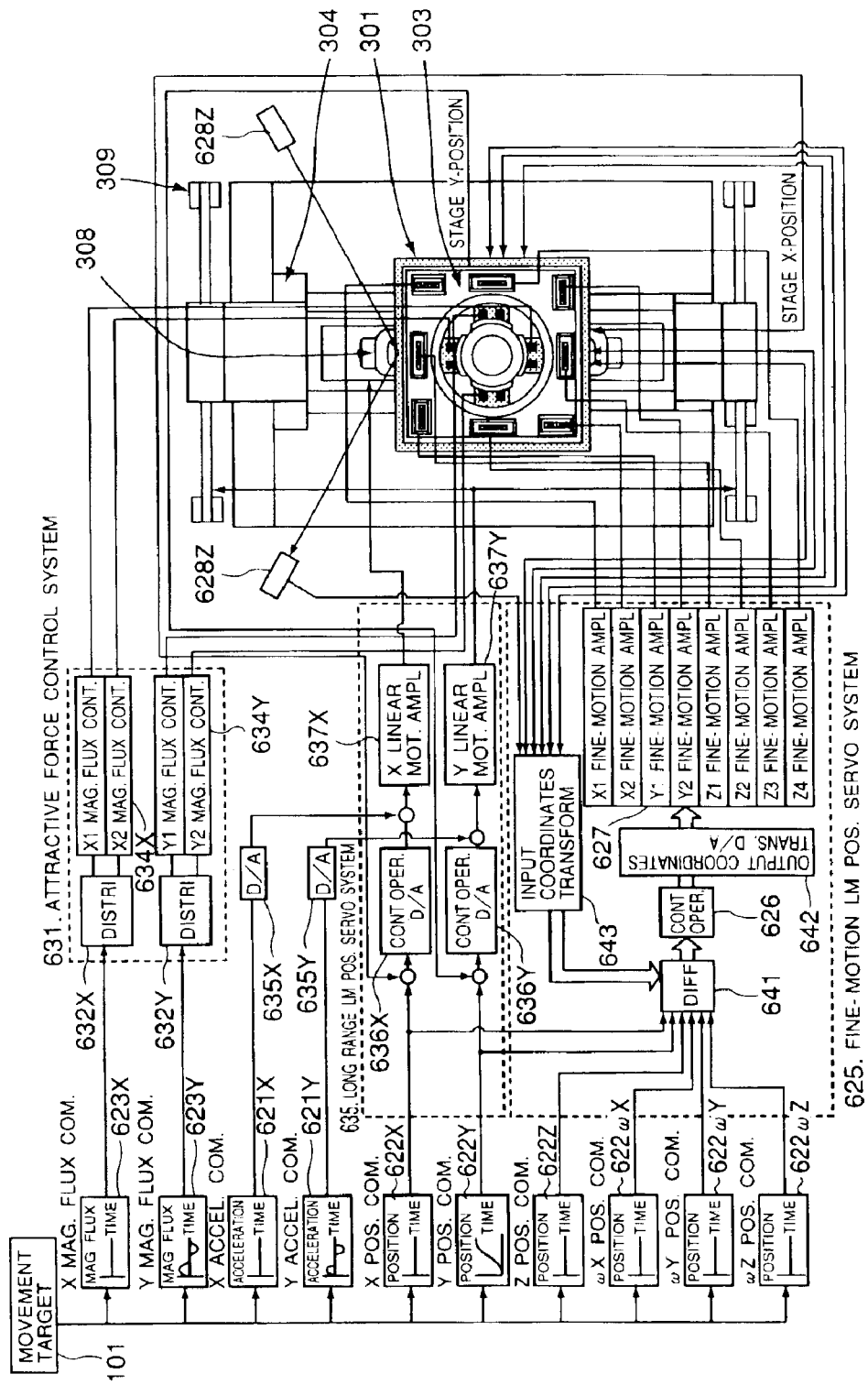
FIG. 6 is a block diagram of a control system according to the second embodiment of the present invention, being in operation for performing a long-range movement only in the Y direction, while keeping the current position with respect to the remaining remaining five-axis directions.

FIG. 6 shows a control block diagram for an example in which a long range motion is necessary in the Y direction, while a current position should be kept in regard to the other five-axis directions.

The control block includes a movement target designator (movement target 101) with respect to six-axis directions, position profile generators for six axes (X position command 622X, Y position command 622Y, Z position command 622Z, ωx position command 622ωx, ωy position command 622ωy, ωz position command 622ωz), each generating the relationship between the time and the position to be assumed at that time, on the basis of the movement target, acceleration profile generators for two X and Y axes (X acceleration command 621X and Y acceleration command 621Y) for generating the relationship between the time and the acceleration to be generated at that time, on the basis of the movement target, and magnetic flux profile generators for two X and Y axes (X magnetic flux command 623X and Y magnetic flux command 623Y) for generating the relationship between the time and the electromagnet magnetic flux to be generated at that time.

The control system comprises a fine-motion LM position control (servo) system 625 for feedback control of the position of the wafer top plate 301 with the use of a fine-motion linear motor, a long-range LM position control (servo) system 635 for feedback control of the position of the X stage 303 with the use of a linear motor, and an attraction force control system 631 for controlling the attraction force of the electromagnet.

The outputs of the position profile generators 622X, 622Y, 622Z, 622ωx, 622ωy, 622ωz are applied to the fine-motion LM position control system 625 and the long-range LM position control system 635. Also, the outputs of the acceleration profile generators 621X and 621Y are applied, after undergoing digital-to-analog conversion through D/A converter 635X and 635Y, to linear motor current amplifiers 637X and 637Y of the long-range LM position control system 635, as a feed-forward signal. Also, the outputs of the magnetic flux profile generators 623X and 623Y are applied to the attraction force control system 631.

The fine-motion LM position servo system 625 comprises an operation unit (output coordinate operation D/A 642), which functions to perform a control operation as can be represented by PID, for example, to the difference between (i) the position (X, Y, Z, ωx, ωy, ωz position) as outputted by the position profile generator 622X, 622Y, 622Z, 622ωx, 622ωy, 622ωz, where the representative position of the wafer top plate 301 should be present currently, and (ii) the position (X, Y, Z, ωx, ωy, ωz position) where the representative position of the wafer top plate 301 is currently present in practice. The result of the control operation is outputted as an analog voltage. The fine-motion position servo system further comprises a fine-motion current amplifier 627 for supplying an electrical current proportional to the thus produced analog output voltage to fine-motion linear motors (X movable elements 402, X stators 412, Y movable elements 403, Y stators 413, Z movable elements 404, Z stators 414), the above-described fine-motion linear motors for applying a thrust to the fine-motion stage, on the basis of the electrical current from the fine-motion current amplifier 627, and an interferometer 628Z for measuring the X, Y and θ positions of the fine-motion linear motor.

Six measured values obtainable with six light beams impinging on the wafer top plate 301 are transformed by an input coordinate transforming unit 643 into representative position coordinates X, Y, Z, ωx, ωy, ωz of the wafer top plate 301. The differences between these values and the position profiles 622X, 622Y, 622Z, 622ωx, 622ωy, 622ωz for the six axes are calculated by a differential calculator 641. On the basis of the differences for the six axes, forces and moments required to be produced for the six axes to remove the differences are then calculated.

The forces and moments for the six axes are the forces and moments for the six axes necessary for making the coordinates of a representative point of the fine-motion stage to a desired value. Practically, eight fine-motion linear motors are used to accomplish this. Therefore, the forces and moments for the six axes have to be converted into commands for the eight fine-motion linear motors. This is achieved by an output coordinate transforming unit 542. In this output coordinate transforming unit 542, D/A conversion is also carried out.

If a large thrust is necessary, a force is obtainable from an attraction force control system 631 to be described later. Even on that occasion, the structure is arranged so that a rotational force attributable to it is not produced, since the fine-motion linear motor is provided only to produce a small thrust necessary for removing a small positional error with respect to the target position. Therefore, no electrical current flows therethrough that may cause a heat generation problem. Also, the electrical current of the linear motor is limited by software or hardware such that, even if the operational association with the attraction force control system 531 malfunctions, the flow of electrical current that may cause a heat generation problem is prohibited.

The long-range LM position control system 635 serves to move the X-Y position of the X stage 303 to follow the position profile 622X, 622Y, 622Z, 622ωx, 622ωy, 622ωz. Although the electromagnet has an advantage that it generates a large attraction force with very little heat generation, a clearance must be maintained between it and the magnetic material plate opposed. In order to continue the application of a desired force from the electromagnet to the magnetic material plate and then to the X stage 303, it is necessary that the electromagnet moves to follow the motion of the X stage 303 to prevent contact at the clearance.

To this end, the position profile 622X, 622Y, 622Z, 622ωx, 622ωy, 622ωz is applied to the long-range LM position control system 635 so as to move the X stage 303 through the X and Y linear motors 308 and 309 to follow the position profile 622X, 622Y, 622Z, 622ωx, 622ωy, 622ωz, substantially the same as that of the wafer top plate 301. By this, the relative position between the X stage 303 and the wafer top plate 301 can be maintained to be substantially constant. During the acceleration, the linear motors 308 and 309 produce, in addition to a thrust corresponding to a combined force of the electromagnet units, a thrust for accelerating the mass of the X stage 303 and the Y stage 304. Through mere FB control, a thrust cannot be generated, unless a positional deviation of some amount is accumulated in the long-range LM position control system 635.

In consideration of this, the outputs of the acceleration profile generators 621X and 621Y are added to the output of the control operation circuit. The resultant is applied to the linear motor current amplifiers 637X and 637Y, and acceleration is designated to the X and Y linear motors 308 and 309 as in feed forward, so as to assure that the X stage 303 is moved without accumulation of positional deviation during the acceleration. Anyway, while the linear motors 308 and 309 involve heat generation to some extent, since the heat source is concentrated locally, cooling is relatively easy. Also, since it can be disposed away from the wafer top plate 301 or from a workpiece to be placed thereon, the influence of heat generation is not easily transmitted.

The electromagnet attraction force control system 631 has a basically similar structure as that of the first embodiment, and it functions as a control system for generating a desired combined thrust between the pair of electromagnet units and the magnetic material plate.

This electromagnet attraction force control system comprises distributors 632X and 632Y for distributing the magnetic profiles 623X and 623Y to one of the two electromagnet control systems, and magnetic flux control systems 634X and 634Y for controlling the magnetic fluxes of the electromagnets in accordance with the magnetic flux profiles 623X and 623Y from the distributors 632X and 632Y.

Figure 7:
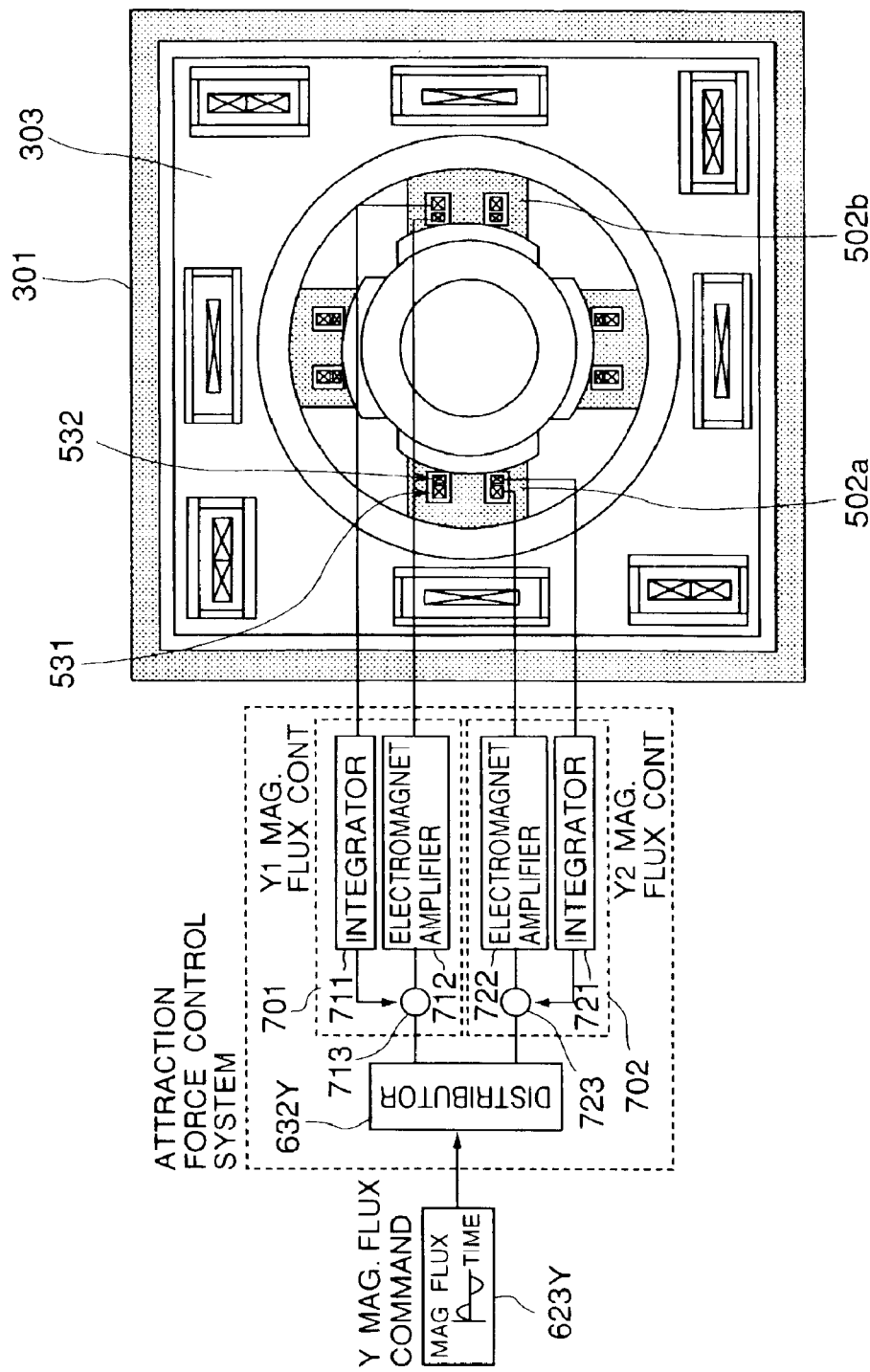
FIG. 7 is a schematic and diagrammatic view of a main portion of a magnetic flux control system for a stage system, according to the second embodiment of the present invention.

The distributors 632X and 632Y each is provided in relation to two magnetic flux control systems (e.g., X1 magnetic flux control system and X2 magnetic flux control system which constitute the magnetic flux control system 634X). FIG. 7 is a schematic and diagrammatic view of a magnetic flux control system in a stage system according to this embodiment. As shown in FIG. 7, each magnetic flux control system (Y1 magnetic flux control system 701 and Y2 magnetic flux control system 702) comprises integrators 711 and 712 for integrating the electrical voltage of the search coil 532 to generate a magnetic flux signal, the above-described magnetic flux profiles 632X and 623Y (only Y magnetic flux command 623Y is shown in FIG. 6), differential circuits 713 and 723 for calculating the difference with respect to the magnetic flux signal, and electromagnet amplifiers 712 and 722 for amplifying the outputs of the circuits 713 and 723 to drive the electromagnets.

The search coil 532 is a coil being wound to share the magnetic path with the driving coil 531. If the magnetic flux produced between the electromagnet yoke and the magnetic material plate changes, an electrical voltage proportional to this changing rate is generated in the search coil 532. Thus, by integrating the signal thereof, the magnetic flux generated between the electromagnet yoke and the magnetic material plate can be detected. The Y1 and Y2 magnetic flux control systems 701 and 702 are arranged to drive the electromagnets while amplifying the integration value, that is, the difference between a signal corresponding to the magnetic flux and the magnetic flux profile 623Y (FIG. 6). Therefore, the magnetic flux generated between the electromagnet and the magnetic material plate is controlled so as to follow the magnetic flux profile 623Y. The attraction force generated between the electromagnet and the magnetic material plate is proportional to the square of the magnetic flux. Therefore, controlling the magnetic flux means controlling the attraction force. Thus, the electromagnet can generate a desired attraction force for acceleration of the stage. The advantages of controlling the magnetic flux are similar to those having been described with reference to the first embodiment.

In FIG. 6, at the respective coordinates of the representative position, the relationships among the position profiles 622X, 622Y, 622Z, 622ωx, 622ωy, 622ωz, the acceleration profiles 621X and 621Y, the magnetic flux profiles 623X and 623Y are substantially the same as those in the first embodiment.

In the manner as described above, the wafer top plate is accelerated by means of a long-range linear motor and an electromagnet. After the acceleration is completed, the electrical current to the electromagnet system is made null and, simultaneously with insulation of floor vibration, the linear motor operates to control the position of the X stage so that the electromagnet and the arcuate magnetic material block do not contact with each other. In parallel to these operations, by means of the fine-motion linear motor, high-precision position control is carried out continuously. With this procedure, a large thrust and low heat generation, as well as high-precision position control, can be accomplished simultaneously.

Figure 15:
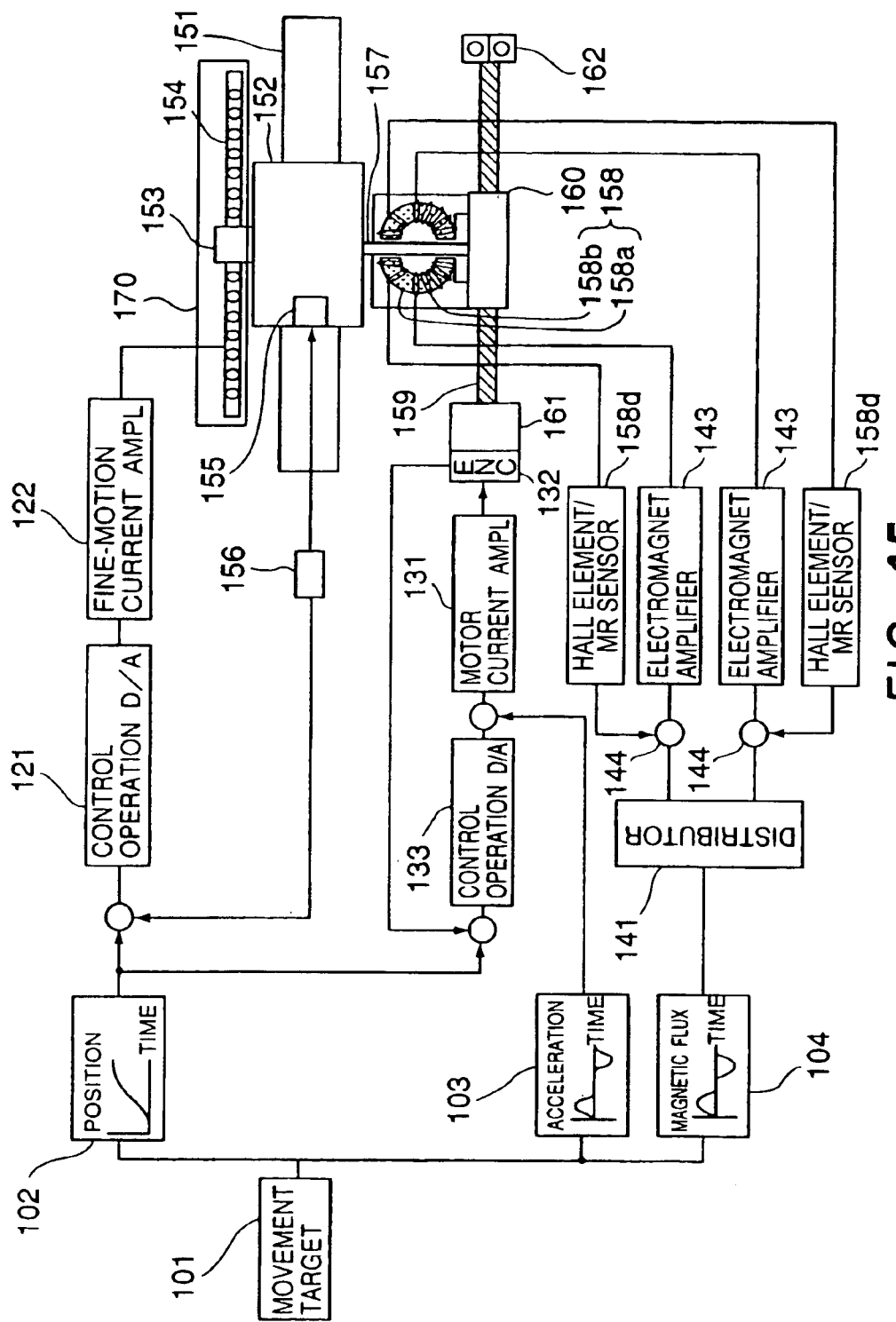
FIG. 15 is a diagrammatic view of a main portion of a stage system according to an embodiment of the present invention.
Figure 16:
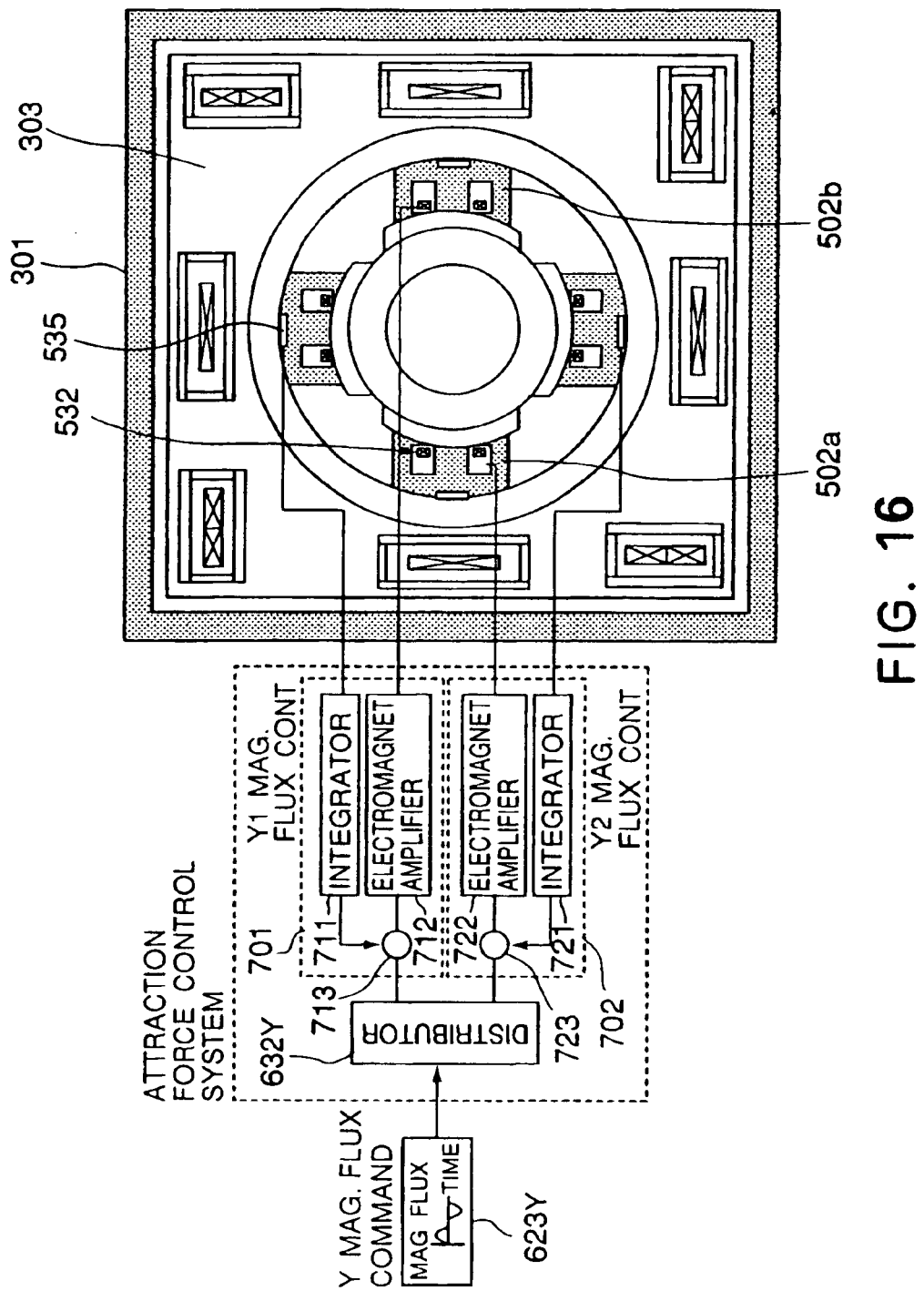
FIG. 16 is a schematic and diagrammatic view of a main portion of a magnetic flux control system for a stage system, according to the second embodiment of the present invention.

In FIG. 6, for control of the magnetic flux, the search coil 532 (FIG. 7) is used to detect a change in magnetic flux, and a magnetic flux signal is obtained by integrating the output of the detection. However, use of a search coil is not always necessary. For example, as shown in FIG. 15, a Hall element or an MR sensor (both denoted with reference numeral 158*d* for simplicity) may be used to directly detect the magnetic flux, and, on that occasion, the integrator may be omitted. Further, as shown in FIG. 16, a strain gauge 535 may be provided between the E-shaped electromagnet 421 and the electromagnet supporting cylinder 422 (both shown in FIG. 4B), which is an environmental member onto which the electromagnet is to be mounted, to detect the driving force generated by the electromagnet, on the basis of a signal from the strain gauge, in place of using the search coil, thereby to control the electromagnet on the basis of it. As a further alternative, a piezoelectric element 535 may be used in place of the strain gauge 535, and the driving force produced by the electromagnet is detected on the basis of a signal from the piezoelectric element 535, to thereby control the electromagnet. (Both the strain gauge and piezoelectric element are labeled with reference numeral 535 for convenience.)

Figure 8A:
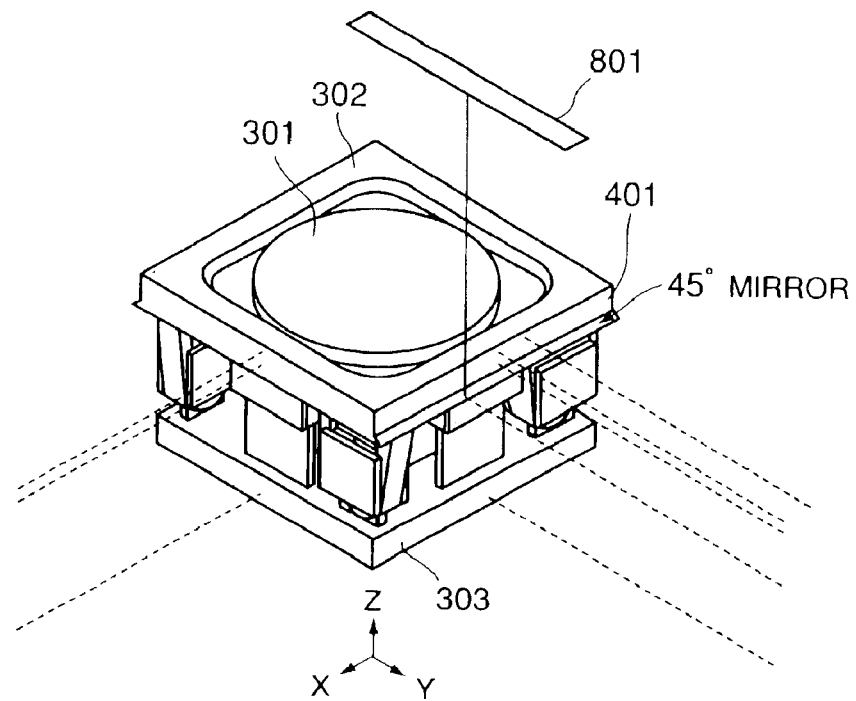
FIGS. 8A and 8B show modified examples of a stage mechanism in a stage system according to the second embodiment of the present invention.
Figure 8B:
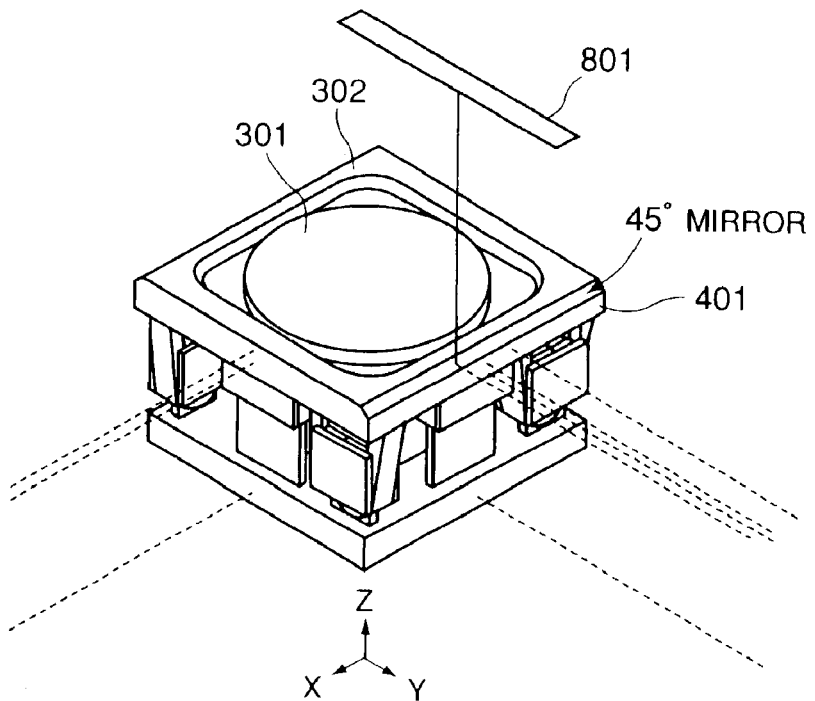

Although FIGS. 3 and 4 show an example wherein one of six light beams is reflected by the wafer surface, all of the six light beams may be reflected by a mirror provided on a stage to measure the position with respect to the six-axis directions. FIGS. 8A and 8B show modified examples of a stage mechanism in a stage system according to this embodiment. In FIGS. 8A and 8B, like numerals similar to those used in FIGS. 3 and 4 are assigned to corresponding elements. As shown in FIGS. 8A and 8B, a 45-deg. mirror (with a slant of approximately 45 degrees) may be mounted on a side face of the wafer top plate 301, and an upper face reference mirror 801 may be provided. On that occasion, without a wafer, the stage position can be controlled very precisely.

The shape of the electromagnet is not limited to the examples disclosed in the above-described embodiments. Any shape known as the shape of ordinary electromagnets may be used.

Furthermore, the stage system in the embodiments described above may be incorporated into an exposure apparatus for transferring a pattern of an original, such as a mask or reticle onto a substrate such as a wafer to be exposed, and it may be used in the manufacture of devices, such as semiconductor elements.

[Embodiment of a Semiconductor Manufacturing System]

Next, an embodiment of a system for manufacturing semiconductor devices, such as semiconductor chips (e.g., ICs or LSIs), liquid crystal panels, CCDs, thin film magnetic heads, or micro-machines, for example, will be described. This system is arranged so that repair of any disorder occurring in a production machine placed in a semiconductor manufacturing factory or periodic maintenance thereof or, alternatively, a maintenance service, such as software supply, can be made by use of a computer network outside the manufacturing factory.

Figure 10:
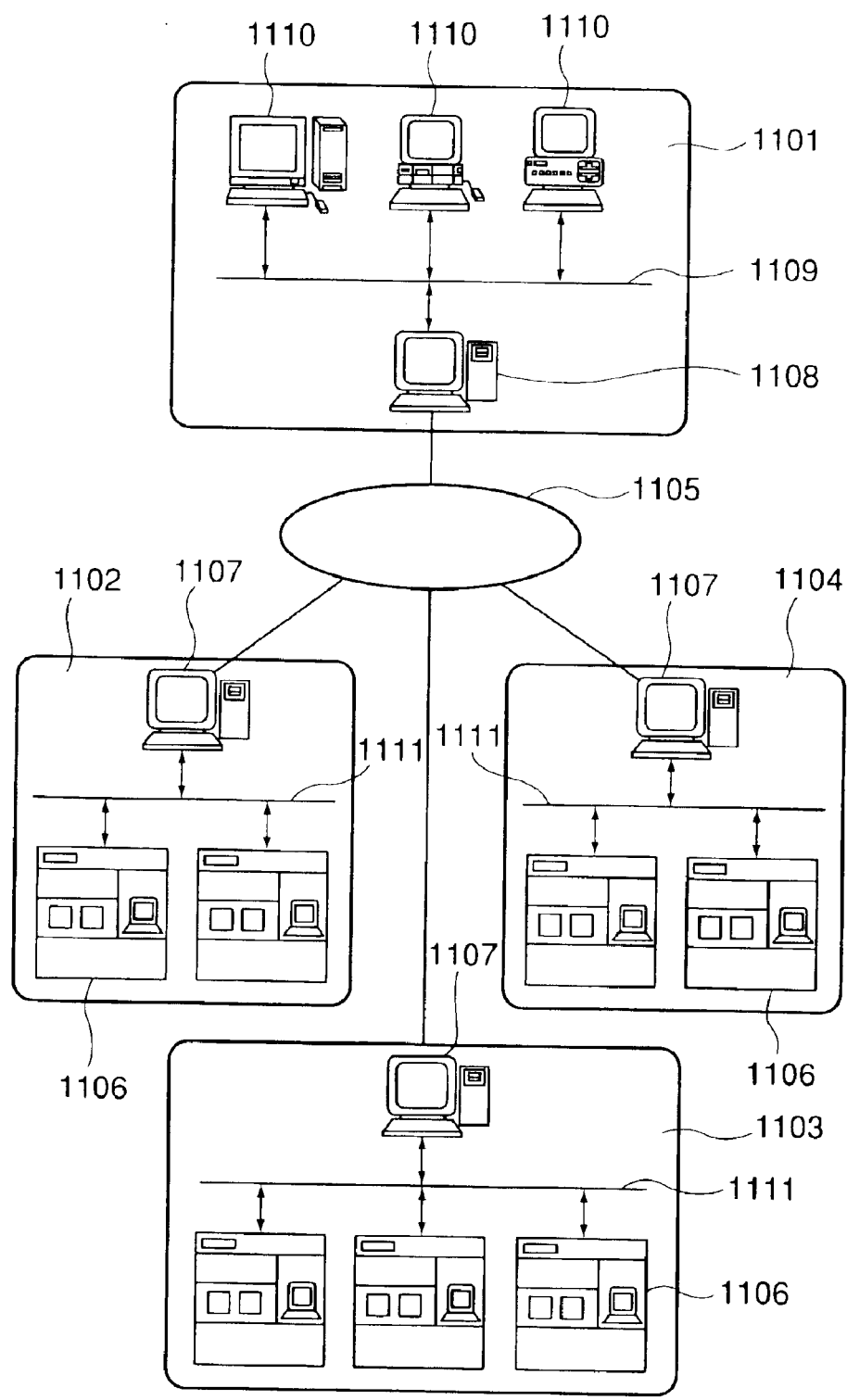
FIG. 10 is a schematic view of a semiconductor device manufacturing system, as viewed in a certain aspect thereof.

FIG. 10 is a schematic view of a general structure of the production system, in a certain aspect thereof. Denoted in the drawing at 1101 is a business office of a vendor (machine supplying maker) for providing semiconductor device manufacturing apparatuses. As examples of such production machines, here, pre-process machines (e.g., various lithographic apparatuses, such as an exposure apparatus, a resist coating apparatus, an etching apparatus, for example, as well as a heat treatment apparatus, a film forming apparatus, and a flattening apparatus) and post-process machines (e.g., an assembling machine and an inspection machine, for example) are assumed. Inside the business office 1101, there are a host control system 1108 for providing a maintenance database for the production machines, plural operating terminal computers 1110, and a local area network (LAN) 1109 for connecting them to constitute an intranet. The host control system 1108 is provided with a gateway for connecting the LAN 1109 to an internet 1105, which is an outside network of the office, and a security function for restricting the access from the outside.

On the other hand, denoted at 1102–1104 are plural manufacturing factories of a semiconductor manufacturer or manufacturers as a user (users) of production machines. The factories 1102–1104 may be those which belong to different manufacturers or to the same manufacturer (e.g. they may be a pre-process factory and a post-process factory). In each of the factories 1102–1104, there are production machines 1106, a local area network (LAN) 1111 for connecting them to constitute an intranet, and a host control system 1107 as a monitoring system for monitoring the state of operation of the production machines 1106. The host control system 1107 in each factory 1102–1104 is provided with a gateway for connecting the LAN 1111 in the factory to the internet 1105, which is an outside network of the factory. With this structure, the host control system 1108 of the vendor 1101 can be accessed from the LAN 1111 in each factory, through the internet 1105. Further, due to the security function of the host control system 1108, only admitted users can access thereto. More specifically, through the internet 1105, status information representing the state of operation of the production machines 1106 (for example, the state of the machine in which any disorder has occurred) may be transmitted as a notice from the factory to the vendor. Additionally, any response information, which is responsive to the notice (that is, for example, information on how the disorder should be treated or software data concerning the treatment) as well as a latest software program and maintenance information such as help information, may be supplied from the vendor. The data communication between each factory 1102–1104 and the vendor 1101 as well as the data communication through the LAN 1111 in each factory, may use a communication protocol (TCP/IP) generally used in the internet. In place of using the internet, an exclusive line network (e.g., an ISDN) controlled with a strictest security that access of a third party is not allowed, may be used. Further, the host control system is not limited to the system as provided by the vendor. A database may be structured by the user, and it may be set in an outside network, such that it can be accessed from plural user factories.

Figure 11:
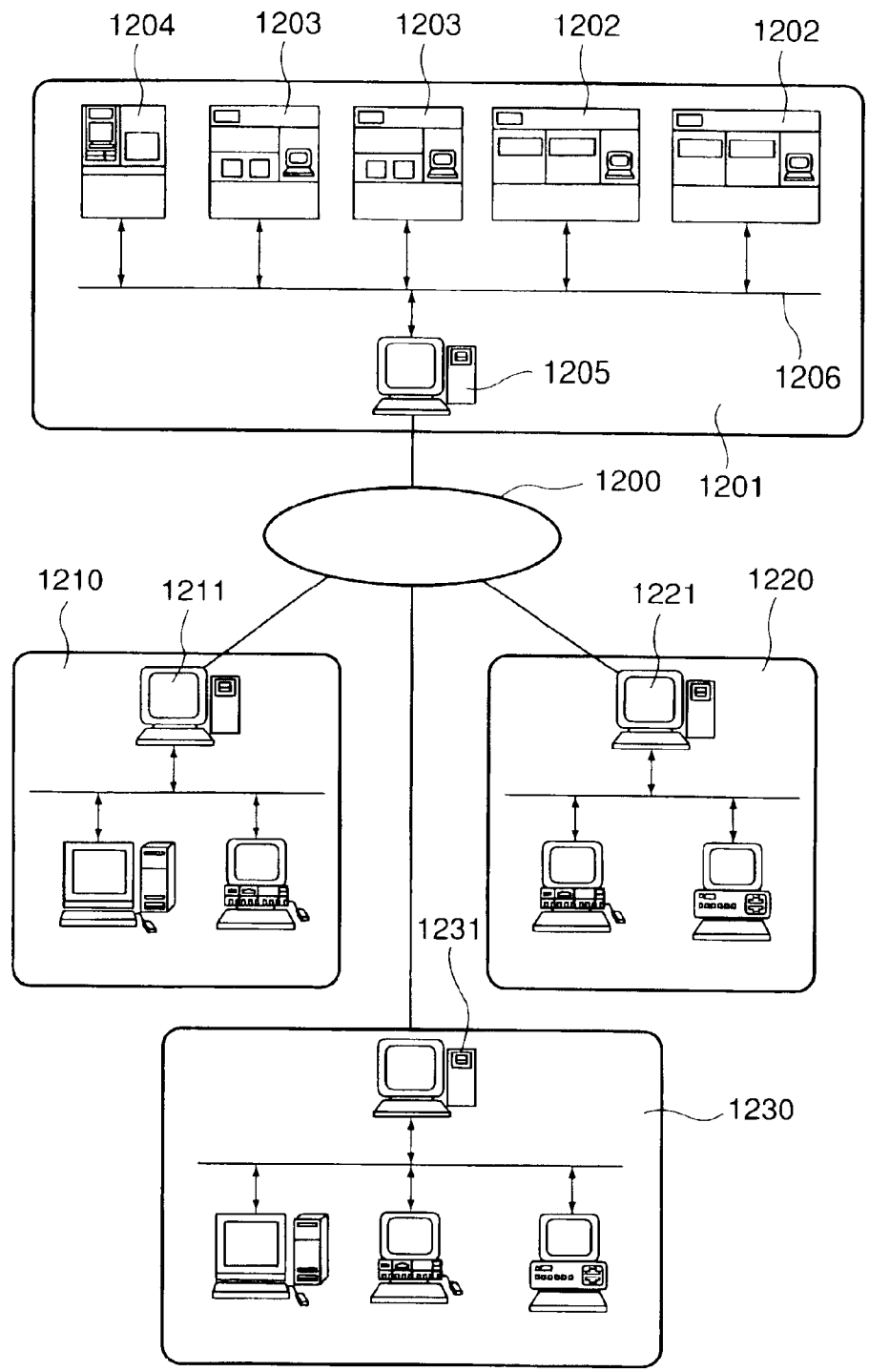
FIG. 11 is a schematic view of a semiconductor device manufacturing system, as viewed in another aspect thereof.

FIG. 11 is a schematic view of a general structure of the production system according to this embodiment, in another aspect thereof different from that of FIG. 10. In the preceding example, plural user factories, each having production machines and the control system of the vendor of the production machines are connected with each other through an external network, so that, through this external network, information related to the production control in each factory or information related to at least one production machine can be data communicated. In this example, as compared therewith, a factory having production machines supplied from different vendors and control systems of these vendors corresponding to the user production machines are connected with each other through an external network, outside the factory, so that the maintenance information for these production machines can be data communicated.

Denoted in the drawing at 1201 is a manufacturing factory of a production machine user (i.e., a semiconductor device manufacturer). Along the production line in the factory, there are many production machines for performing various processes, that is, in this example, an exposure apparatus 1202, a resist processing apparatus 1203, and a film formation processing apparatus 1204 are introduced. Although only one factory 1201 is illustrated in the drawing, in practice, plural factories may be arranged into the network. Each production machine in the factory is connected through a LAN 1206 to constitute an intranet. The operation of the production line is controlled by a host control system 1205.

On the other hand, in the business offices of vendors (machine supplying makers), such as an exposure apparatus manufacturer 1210, a resist processing machine manufacturer 1220, and a film forming machine manufacturer 1230, for example, there are host control systems 1211, 1221 and 1213 for performing remote control maintenance for the machines they supplied. Each of these host control systems is equipped with a maintenance database and a gateway for the outside network. The host control system 1205 for controlling the machines in the user factory and the control systems 1211, 1221 and 1231 of the machine vendors are connected with each other through the external network 1200 (internet), or an exclusive line network. If, in this production system, any disorder occurs in any one of the production machines in the production line, the operation of the production machine is stopped. However, this can be met quickly through the remote control maintenance for the disordered machine, from the corresponding machine vendor and by way of the internet 1200. Therefore, the suspension of the production line is short.

Figure 12:
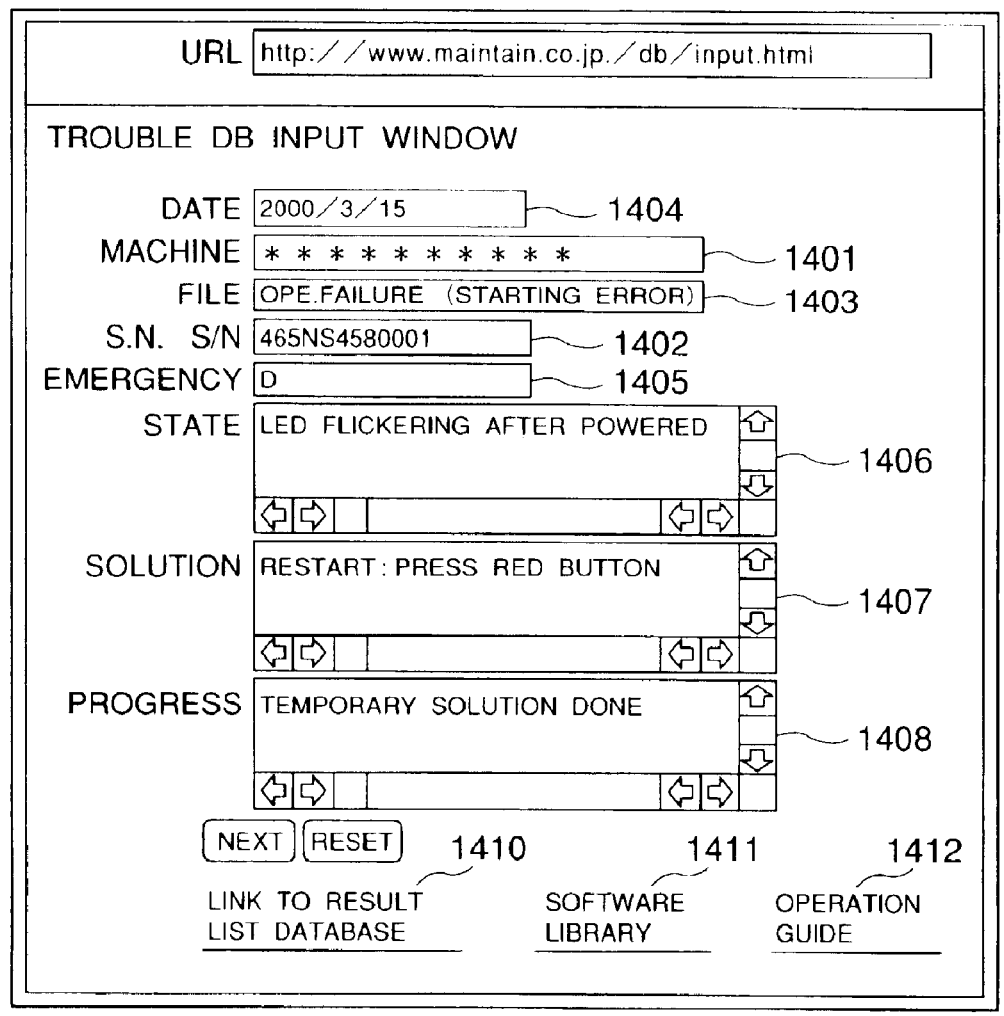
FIG. 12 is a schematic view for explaining an example of a user interface.

Each of the production machines in the factory may have a display, a network interface and a computer for executing network accessing software, stored in a storage device, as well as machine operating software. The storage device may be an internal memory or a hard disk or, alternatively, it may be a network file server. The network accessing software may include an exclusive or a wide-use web browser, and a user screen interface, such as shown in FIG. 12, for example, may be provided on the display. Various data may be inputted into the computer (input zones on the screen) by an operator who controls the production machines in each factory, such as, for example, machine type (1401), serial number (1402), trouble file name (1403), date of disorder (1404), emergency level (1405), status (1406), solution or treatment (1407), and progress (1408). The thus inputted information is transmitted to the maintenance database through the internet. In response, appropriate maintenance information is replied from the maintenance database to the user's display. Further, the user interface as provided by the web browser enables a hyperlink function (1410–1412), as illustrated. As a result, the operator can access further details of information in each item, or he/she can get the latest version software to be used for the production machine, from the software library as provided by the vendor. Alternatively, the operator can get an operation guide (help information) prepared for factory operators.

Next, a semiconductor device manufacturing process, which uses the production system described above, will be explained.

Figure 13:
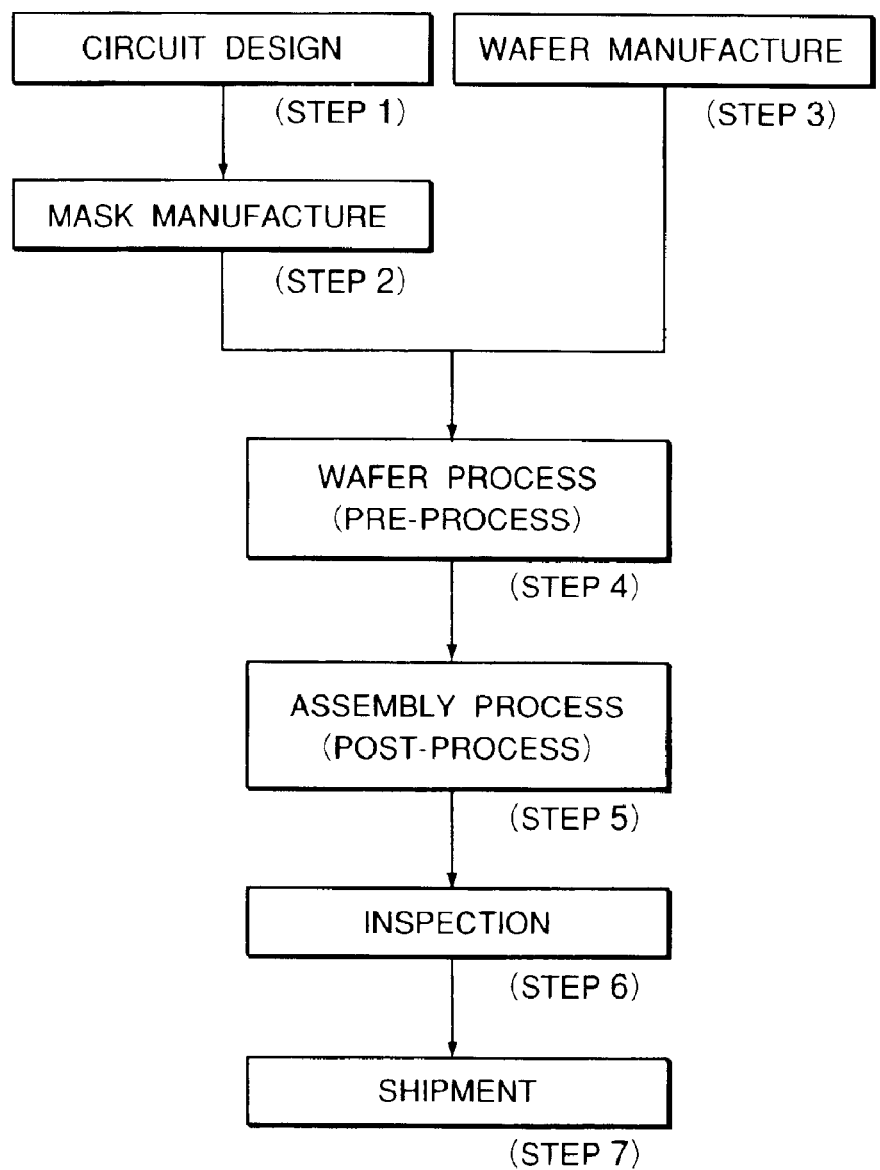
FIG. 13 is a flow chart for explaining device manufacturing processes.

FIG. 13 is a flow chart of a general procedure for the manufacture of microdevices.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process), wherein, by using the so prepared mask and wafer, circuits are practically formed on the wafer through lithography. Step 5, subsequent to this, is an assembling step (called a post-process), wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

The pre-process and the post-process may be performed in separate exclusive factories. In each factory, the maintenance is carried out on the basis of the remote maintenance system described hereinbefore. Further, between the pre-process factory and the post-process factory, data communication for the information related to the production control and the machine maintenance may be done by use of the internet or an exclusive line network.

Figure 14:
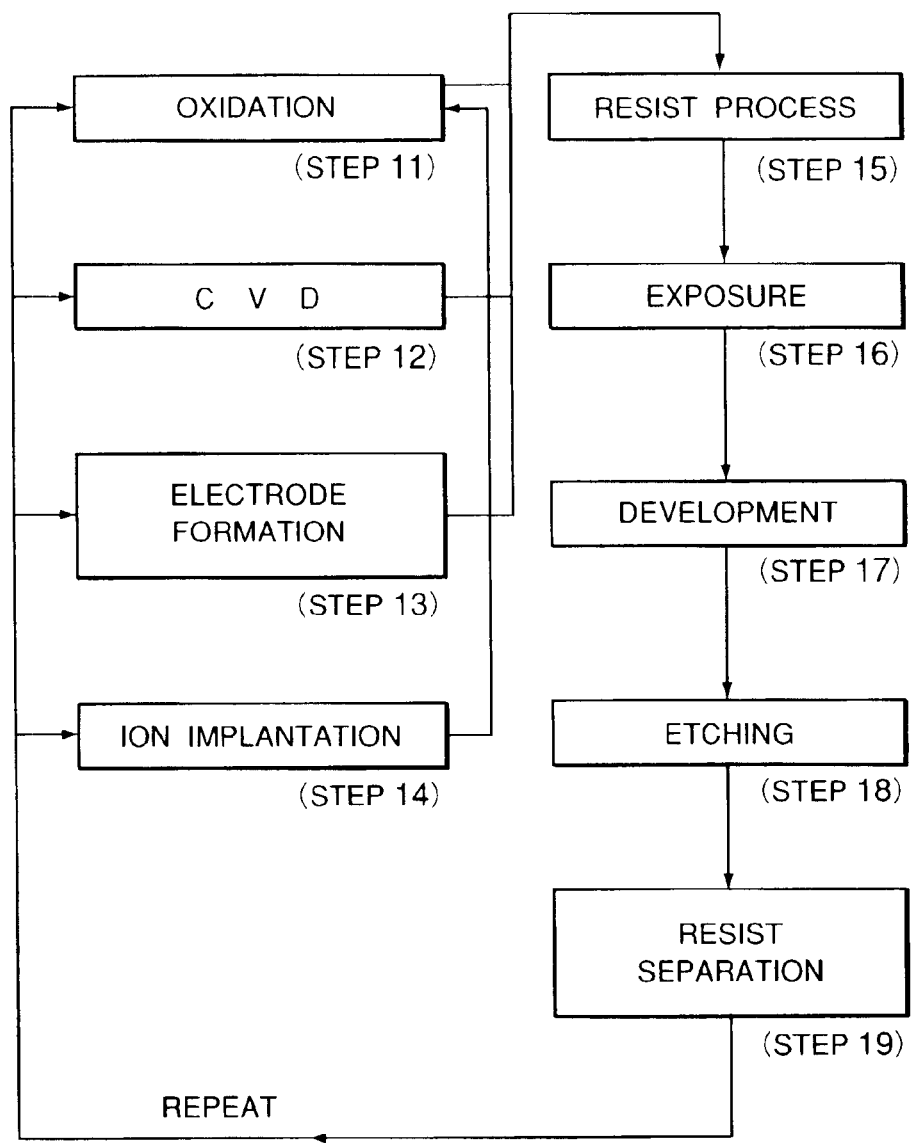
FIG. 14 is a flow chart for explaining details of a wafer process.

FIG. 14 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

Since the machines used in these processes are maintained through a remote maintenance system, as described above, any disorder may be prevented beforehand. If it occurs, it can be met quickly. Therefore, the device productivity can be improved significantly.

While the invention has been described with reference to the structures disclosed herein, it is not confined to the details set forth and this application is intended to cover such modifications or change as may come within the purposes of the improvements or the scope of the following claims.

What is claimed is:

1. A stage system comprising:
    a movable stage;
    a force applying mechanism for applying, by use of an electromagnet, a force to said stage in a direction of a magnetic flux generated by said electromagnet;
    a moving mechanism for moving said electromagnet in a movement direction of said stage; and
    a controller for controlling a magnetic force of said electromagnet, wherein said controller includes a detector for detecting a magnetic flux signal of said electromagnet.

2. A stage system according to claim 1, wherein said detector is arranged to detect a change in magnetic flux of said electromagnet by use of a search coil, and also to detect the magnetic flux signal through integration of an electrical voltage of the search coil.

3. A stage system according to claim 1, wherein said detector is arranged to detect the magnetic flux signal of said electromagnet by use of a Hall element.

4. A stage system according to claim 1, wherein said detector is arranged to detect the magnetic flux signal of said electromagnet by use of a magnetic resistance element.

5. A stage system according to claim 1, wherein said controller is arranged to generate, in said electromagnet, a force which is proportional to acceleration of said stage.

6. A stage system according to claim 1, further comprising a Lorentz's force generating mechanism for generating Lorentz's force in said stage, wherein said Lorentz's force generating mechanism is arranged to apply a force to said stage from at least two sides of said stage.

7. A stage system according to claim 1, wherein a line of action of the force generated by said electromagnet substantially passes a gravity center of said stage.

8. A stage system according to claim 6, further comprising a second moving mechanism for moving a portion of said Lorentz's force generating mechanism in the movement direction of said stage.

9. A stage system according to claim 1, wherein the position of said stage and the position of said moving mechanism are measured individually.

10. A stage system according to claim 7, wherein the position of said stage is controlled by means of said Lorentz's force generating mechanism.

11. A stage system comprising:
    a movable stage;
    a force applying mechanism for applying, by use of an electromagnet, a force to said stage in a direction of a magnetic flux generated by said electromagnet;
    a moving mechanism for moving said electromagnet in a movement direction of said stage; and
    a controller for controlling one of the magnetic force of said electromagnet and a generated force thereof,
    wherein said controller is arranged to detect a driving force generated by said electromagnet by use of a strain gauge or a piezoelectric element, and also to control said electromagnet on the basis of the detection.

12. A stage system comprising:
    a movable stage;
    a force applying mechanism for applying, by use of an electromagnet, a force to said stage in a direction of a magnetic flux generated by said electromagnet;
    a moving mechanism for moving said electromagnet in a movement direction of said stage; and
    a controller for controlling one of the magnetic force of said electromagnet and a generated force thereof,
    wherein said controller includes a command applying unit for designating a generated force of said electromagnet, a detector for detecting a generated force of said electromagnet, an operation unit for calculating a difference between the generated force detected by said detector and the generated force designated by said command applying unit, and an amplifier for amplifying an output of said operation unit to drive said electromagnet.

13. A stage system according to claim 12, wherein said detector detects the generated force generated by said electromagnet by use of a strain gauge or a piezoelectric element, and wherein said electromagnet is controlled on the basis of the detection.

14. A stage system according to claim 12, wherein said controller is arranged to generate, in said electromagnet, a force which is proportional to acceleration of said stage.

15. A stage system according to claim 12, further comprising a Lorentz's force generating mechanism for generating Lorentz's force in said stage, wherein said Lorentz's force generating mechanism is arranged to apply a force to said stage from at least two sides of said stage.

16. A stage system according to claim 12, wherein a line of action of the force generated by said electromagnet substantially passes a gravity center of said stage.

17. A stage system according to claim 15, further comprising a second moving mechanism for moving a portion of said Lorentz's force generating mechanism in the movement.

18. A stage system according to claim 12, wherein the position of said stage and the position of said moving mechanism are measured individually.

19. A stage system according to claim 16, wherein the position of said stage is controlled by means of said Lorentz's force generating mechanism.

20. A stage system, comprising:
a stage for carrying a workpiece thereon, said stage including a portion of a Lorentz's force generating mechanism arranged to generate moments and forces in plural-axis directions and a plurality of magnetic material plates arranged to receive a generated force along a plane;
a plurality of electromagnets each being arranged to apply a force to said stage in a direction of a magnetic flux generated by a respective electromagnet, said electromagnets being arranged to generate a force along a plane;
a moving mechanism for moving the plurality of electromagnets along a plane so as to move the plurality of electromagnets in the movement direction of said stage, and also for moving a portion of said Lorentz's force generating mechanism along a plane;
a controller for controlling a magnetic flux of said electromagnets or a generated force of said electromagnets, said controller including at least a command applying unit for designating a magnetic flux signal of said electromagnets or a generated force signal of said electromagnets, and a detector for detecting the magnetic flux signal of said electromagnets or the generated force signal of said electromagnets;
an operation unit for calculating a difference between the magnetic flux signal or the generated force signal detected by said detector and a magnetic flux command or a generated force command designated by said command applying unit; and
an amplifier for amplifying an output of said operation unit to drive said electromagnets.

21. A stage system according to claim 20, wherein each of said electromagnets comprises an E-shaped yoke, a driving coil and a search coil, wherein said driving coil is arranged to generate a magnetic flux between the E-shaped yoke and the magnetic material plate provided on said stage, and wherein said search coil is arranged to detect a change in magnetic flux generated by said driving coil.

22. A stage system according to claim 20, wherein the position of said stage is measured with respect to six-axis directions, by means of a light beam.

23. A stage system according to claim 20, wherein the position of said stage is controlled by means of said Lorentz's force generating mechanism.

24. A stage system according to claim 20, wherein the position of said stage is measured with respect to six-axis directions, by means of an interferometer.

25. A stage system according to claim 20, wherein said stage includes a reflection mirror having a 45-degree slant face.

26. A stage system according to claim 20, wherein said detector is arranged to detect a generated force produced by said electromagnets, by use of a strain gauge or a piezoelectric element.

27. A stage system according to claim 26, wherein the position of said stage is measured with respect to six-axis directions, by means of a light beam.

28. A stage system according to claim 26, wherein the position of said stage is controlled by means of said Lorentz's force generating mechanism.

29. A stage system according to claim 26, wherein said stage includes a reflection mirror having a 45-degree slant face.

30. An exposure apparatus for transferring, by exposure, a pattern of an original onto a substrate, said apparatus comprising:
a stage system as recited in claim 20.

31. An apparatus according to claim 30, further comprising a display, a network interface and a computer for executing network software, wherein maintenance information related to said exposure apparatus is data communicated through the computer network.

32. An apparatus according to claim 31, wherein the network software provides on the display a user interface for accessing a maintenance database prepared by a vendor or a user of said exposure apparatus and connected to an external network outside a factory where said exposure apparatus is placed, thereby to enable obtaining information from the database through the external network.

33. A device manufacturing method, comprising the steps of:
providing a group of production machines for performing various processes, including an exposure apparatus as recited in claim 30, in a semiconductor manufacturing factory; and
producing a semiconductor device through plural processes using the production machine group.

34. A method according to claim 33, further comprising (i) connecting the production machines of the group with each other through a local area network, and (ii) executing data-communication concerning information related to at least one production machine of the production machine group, between the local area network and an external network outside the semiconductor manufacturing factory.

35. A method according to claim 34, further comprising performing at least one of (i) accessing a database provided by a vendor or a user of the exposure apparatus through the external network so that maintenance information related to the production machine can be obtained through the data communication, and (ii) production control on the basis of data communication made through the external network and between the semiconductor factory and a separate semiconductor factory.

36. A semiconductor manufacturing factory, comprising:
a group of production machines for performing various processes, including an exposure apparatus as recited in claim 30;
a local area network for connecting the production machines of the production machine group with each other; and a gateway for enabling an access from the local area network to an external network outside the factory, wherein information related to at least one production machine in the group can be data communicated by use of the local area network and the gateway.

37. A method of executing maintenance for an exposure apparatus provided in a semiconductor manufacturing factory and as recited in claim 30, said method comprising the steps of:

preparing, by a vendor or a user of the exposure apparatus, a maintenance database connected to an external network outside the semiconductor manufacturing factory;

admitting access from the semiconductor manufacturing factory to the maintenance database through the external network; and transmitting maintenance information stored in the maintenance database to the semiconductor manufacturing factory through the external network.

38. A stage system comprising:

a movable stage;

a force applying mechanism for applying, by use of an electromagnet, a force to said stage in a direction of a magnetic flux generated by said electromagnet;

a moving mechanism for moving said electromagnet in a movement direction of said stage; and a controller for controlling one of the magnetic force of said electromagnet and a generated force thereof, wherein said controller includes a detector for detecting a magnetic flux signal of said electromagnet, and said controller is arranged to generate in said electromagnet a force, which is proportional to acceleration of said stage.

39. A stage system according to claim 38, further comprising a Lorentz's force generating mechanism for generating Lorentz's force in said stage, wherein said Lorentz's force generating mechanism is arranged to apply a force to said stage from at least two sides of said stage.

40. A stage system according to claim 38, wherein a line of action of the force generated by said electromagnet substantially passes a gravity center of said stage.

41. A stage system according to claim 39, further comprising a second moving mechanism for moving a portion of said Lorentz's force generating mechanism in the movement direction of said stage.

42. A stage system according to claim 38, wherein the position of said stage and the position of said moving mechanism are measured individually.

43. A stage system according to claim 40, wherein the position of said stage is controlled by means of said Lorentz's force generating mechanism.

44. A stage system comprising:

a stage for carrying a workpiece thereon, said stage including a portion of a Lorentz's force generating mechanism arranged to generate moments and forces in plural-axis directions and a plurality of magnetic material plates arranged to receive a generated force along a plane;

a plurality of electromagnets arranged to apply a force to said stage along a plane;

a moving mechanism for moving the plurality of electromagnets along a plane, and also for moving a portion of said Lorentz's force generating mechanism along a plane;

a controller for controlling a magnetic flux of said electromagnets or a generated force of said electromagnets, and said controller including at least a command applying unit for designating a magnetic flux signal of said electromagnets or a generated force signal of said electromagnets, and a detector for detecting the magnetic flux signal of said electromagnets or the generated force signal of said electromagnets;

an operation unit for calculating a difference between the magnetic flux signal or the generated force signal detected by said detector and a magnetic flux command or a generated force command designated by said command applying unit; and an amplifier for amplifying an output of said operation unit to drive said electromagnets.

45. A stage system according to claim 44, wherein the direction in which said moving mechanism moves the plurality of electromagnets is the same as the direction in which the plurality of electromagnets moves said stage.

* * * * *

UNITED STATES PATENT AND TRADEMARK OFFICE
CERTIFICATE OF CORRECTION

PATENT NO. : 6,859,257 B2  
DATED : February 22, 2005  
INVENTOR(S) : Nobushige Korenaga It is certified that error appears in the above-identified patent and that said Letters Patent is hereby corrected as shown below:

Title page,
Item [56], References Cited, U.S. PATENT DOCUMENTS,
"5,841,250 A   11/1998   Korenage et al. ......................318/135" should read
-- 5,841,250 A   11/1998   Korenaga et al. ......................318/135 --

Column 2,
Line 23, "electromagnet" should read -- electromagnet. --.

Column 5,
Line 3, "invention-will" should read -- invention will --.

Column 8,
Line 56, "Idealistically," should read -- Ideally, --.

Column 9,
Line 52, "is" should read -- it --.

Column 16,
Line 13, "a nd mom ents" should read -- and moments --.

Column 23,
Line 19, "ment." should read -- ment direction of said stage. --.

Signed and Sealed this

Ninth Day of August, 2005

JON W. DUDAS  
*Director of the United States Patent and Trademark Office*